(12) United States Patent
Vendt et al.

(10) Patent No.: US 12,009,361 B2
(45) Date of Patent: Jun. 11, 2024

(54) PROTECTION DEVICES WITH TRIGGER DEVICES AND METHODS OF FORMATION THEREOF

(71) Applicant: Infineon Technologies AG, Neubiberg (DE)

(72) Inventors: Vadim Valentinovic Vendt, Munich (DE); Joost Willemen, Munich (DE); Andre Schmenn, Sachsenkam (DE); Damian Sojka, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/100,043

(22) Filed: Jan. 23, 2023

(65) Prior Publication Data

US 2023/0163123 A1 May 25, 2023

Related U.S. Application Data

(60) Continuation of application No. 16/919,833, filed on Jul. 2, 2020, now Pat. No. 11,600,615, which is a
(Continued)

(51) Int. Cl.
*H01L 27/06* (2006.01)
*H01L 27/02* (2006.01)
(Continued)

(52) U.S. Cl.
CPC ........ *H01L 27/067* (2013.01); *H01L 27/0262* (2013.01); *H01L 29/6609* (2013.01);
(Continued)

(58) Field of Classification Search
CPC ............. H01L 27/067; H01L 27/0262; H01L 27/0658; H01L 27/0647; H01L 27/0641; H01L 27/0623; H01L 27/0629; H01L 27/0259; H01L 27/0255; H01L 27/0237; H01L 29/6609; H01L 29/86; H01L 29/66363; H01L 29/66371; H01L 29/66386; H01L 29/66393; H01L 29/732; H01L 29/74; H01L 29/7404;
(Continued)

(56) References Cited

U.S. PATENT DOCUMENTS

| 4,956,690 A | 9/1990 | Kato |
| 5,281,847 A | 1/1994 | Tokunoh |

(Continued)

FOREIGN PATENT DOCUMENTS

| CN | 102456687 A | 5/2012 |
| DE | 69715109 T2 | 10/2002 |

(Continued)

*Primary Examiner* — Natalia A Gondarenko
(74) *Attorney, Agent, or Firm* — Murphy, Bilak & Homiller, PLLC

(57) ABSTRACT

A method of forming a semiconductor device includes forming a first vertical protection device comprising a thyristor in a substrate, forming a first lateral trigger element for triggering the first vertical protection device in the substrate, and forming an electrical path in the substrate to electrically couple the first lateral trigger element with the first vertical protection device.

6 Claims, 39 Drawing Sheets

Related U.S. Application Data division of application No. 14/817,928, filed on Aug. 4, 2015, now Pat. No. 10,741,548.

(60) Provisional application No. 62/146,777, filed on Apr. 13, 2015.

(51) Int. Cl.
  *H01L 29/66* (2006.01)
  *H01L 29/732* (2006.01)
  *H01L 29/74* (2006.01)
  *H01L 29/861* (2006.01)

(52) U.S. Cl.
  CPC ...... *H01L 29/861* (2013.01); *H01L 29/66371* (2013.01); *H01L 29/732* (2013.01); *H01L 29/7404* (2013.01)

(58) Field of Classification Search
  CPC ............ H01L 29/7408; H01L 29/7416; H01L 29/7432; H01L 29/7436; H01L 29/747; H01L 29/8605; H01L 29/861; H01L 29/87; H01L 29/872; H01L 29/66174; H01L 29/66189; H01L 29/42304; H01L 29/41708; H01L 21/74–746; H01L 21/76898; H01L 21/82; H01L 21/8249; H01L 27/0248; H01L 27/0251; H01L 27/0635; H01L 27/0274; H01L 27/0277; H01L 27/082–0828; H01L 23/481; H01L 23/535; H01L 23/60; H01L 24/06; H01L 24/05; H01L 24/03; H01L 24/94; H01L 2224/03002; H01L 2224/06181; H01L 2224/0557; H01L 2224/94; H01L 2924/10272; H01L 2924/12031; H01L 2924/12035; H01L 2924/1301; H01L 2924/1305; H01L 2924/13091; H01L 2924/1033; H01L 2924/12036; H01L 2924/13055; H01L 2924/14
  USPC ............... 257/146, 119, 121, 122, 107, 538; 438/133, 309, 381, 424, 479
  See application file for complete search history.

(56) References Cited

U.S. PATENT DOCUMENTS

| | | | |
|---|---|---|---|
| 6,034,381 | A | 3/2000 | Pezzani |
| 6,049,096 | A | 4/2000 | Bernier |
| 6,570,193 | B1 | 5/2003 | Koga et al. |
| 6,963,087 | B2 | 11/2005 | Gimonet et al. |
| 8,338,855 | B2* | 12/2012 | Menard ............... H01L 29/747 |
| | | | 257/119 |
| 8,441,104 | B1* | 5/2013 | Hu ........................ H01L 23/481 |
| | | | 257/443 |
| 2004/0082136 | A1 | 4/2004 | Hutcheson |
| 2004/0135170 | A1 | 7/2004 | Menard |
| 2004/0188841 | A1 | 9/2004 | Chen et al. |
| 2005/0006706 | A1 | 1/2005 | Stefanov et al. |
| 2005/0029540 | A1 | 2/2005 | Kodama et al. |
| 2005/0082565 | A1 | 4/2005 | Menard et al. |
| 2005/0151160 | A1 | 7/2005 | Salcedo et al. |
| 2008/0308837 | A1 | 12/2008 | Gauthier et al. |
| 2009/0273868 | A1* | 11/2009 | Liu .................... H01L 27/0262 |
| | | | 361/56 |
| 2010/0244090 | A1 | 9/2010 | Bobde et al. |
| 2012/0099229 | A1 | 4/2012 | Domanski et al. |
| 2012/0261804 | A1 | 10/2012 | Li et al. |
| 2013/0049203 | A1* | 2/2013 | Ahrens .................. H01L 29/41 |
| | | | 257/E23.06 |
| 2013/0320512 | A1 | 12/2013 | Irsigler et al. |
| 2014/0252473 | A1 | 9/2014 | Loechelt et al. |
| 2014/0252484 | A1 | 9/2014 | Loechelt et al. |

FOREIGN PATENT DOCUMENTS

| | | |
|---|---|---|
| DE | 69825096 T2 | 8/2004 |
| JP | 2008172201 A | 7/2008 |
| KR | 20100031094 A | 3/2010 |

* cited by examiner

PROTECTION DEVICES WITH TRIGGER DEVICES AND METHODS OF FORMATION THEREOF

CROSS-REFERENCE TO RELATED APPLICATIONS

This application is a continuation of U.S. patent Ser. No. 16/919,833, filed on Jul. 2, 2020, which is a divisional application of U.S. patent Ser. No. 14/817,928, filed on Aug. 4, 2015, which claims the benefit of U.S. Provisional Application 62/46,77, filed on Apr. 13, 2015, which applications are hereby incorporated herein in their entirety.

TECHNICAL FIELD

The present invention relates generally to semiconductor devices, and, in particular embodiments, to protection devices with trigger devices and methods of formation thereof.

BACKGROUND

Electrical Overstress (EOS) is considered as the exposure of a device or an integrated circuit (IC) to a current or voltage beyond its absolute maximum ratings. EOS can occur due to voltage overshoots resulting in high destructive currents.

One type of EOS is Electrostatic Discharge (ESD), which is known as transfer of electrostatic charge between bodies or surfaces at different electrostatic potential. ESD can happen due to sudden discharge of charge from a charged body. The ESD occurs when differently-charged objects are brought close together or when the dielectric between them breaks down, often creating a visible spark. ESD is a high current event in the typical range of 0.1 A to 30 A in a very short period of time from 1 ns to 200 ns.

Another type of EOS relates to fast transient voltage surges. The most intense transient relate to lightning and industrial surges. Transient overvoltage events are usually of short duration, from several microseconds to a few milliseconds, but longer than FSD events. Transient voltage surges waveforms can be oscillatory or impulsive. The waveforms typically have a rising wavefront usually on the order of 0.5 µs to 10 µs. Transient over-voltages may range from 1 kV to 50 kV.

Avalanche diodes are commonly used for ESD protection, whereas transistor structures with a snap-back (negative differential resistance region) are used for reduced clamping voltages. Silicon Controlled Rectifier (SCR) or thyristor are used for special purposes where even lower clamping voltages are needed because of the very low holding voltage after latch-up. Up to now SCR are used for on-chip ESD protection because of their high robustness per area. Because of their area efficiency and low clamping voltage during on-state, a thyristor can also be used as discrete protection device for system level ESD.

SUMMARY

In accordance with an embodiment of the present invention, a semiconductor device comprises a vertical protection device including a thyristor and a lateral trigger element disposed in a substrate. The lateral trigger element is for triggering the vertical protection device.

In accordance with an embodiment of the present invention, a semiconductor device comprises a vertical protection device and a lateral trigger element disposed in a substrate. The vertical protection device comprises an anode/cathode terminal at a first major surface of the substrate, a trigger input terminal disposed in the substrate, and a cathode/anode terminal. The lateral trigger element comprises a first terminal region coupled to the anode/cathode terminal of the vertical device, and a second terminal region laterally spaced from the first terminal region and coupled to the trigger input terminal.

In accordance with an embodiment of the present invention, a method of forming a semiconductor device, the method comprising forming a vertical protection device in a substrate and forming a lateral trigger element for triggering the vertical protection device in the substrate. The method further includes forming an electrical path in the substrate to electrically couple the lateral trigger element with the vertical protection device.

BRIEF DESCRIPTION OF THE DRAWINGS

For a more complete understanding of the present invention, and the advantages thereof, reference is now made to the following descriptions taken in conjunction with the accompanying drawings, in which:

FIG. 4A illustrates a cross-sectional view of an embodiment of an ESD protection device comprising a vertical device and a lateral trigger element, wherein FIGS. 4B and 4D illustrates a possible top schematic view of ESD protection device in one embodiment, and wherein

FIGS. 7A-7D illustrates alternative embodiments of an ESD protection device comprising a vertical device and a lateral trigger element in which the base region of the lateral trigger element is formed separately, wherein FIGS. 7A-7C illustrate cross-sectional views and FIG. 7D illustrates a top view;

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a silicon controlled rectifier (SCR) structure applied to electrostatic discharge protection. The invention may also be applied, however, to other semiconductor structures as well as to other applications such as surge protection including transient voltage protection devices.

ESD protection devices as well as TVS protection devices are difficult to tune with respect to ESD targets. For example, changing the breakdown voltage is difficult without changing other metrics of the protection device. Embodiments of the present invention overcome these limitations by using a separate lateral trigger device that is independent of the vertical protection device. The lateral trigger device is used to trigger the vertical protection device and may be engineered separately to switch faster and at a lower threshold voltage. Embodiments of the present invention overcome the problems with the conventional designs by coupling the lateral trigger device with the back side contact as well as the trigger input of the vertical protection device by the use of a metallic interconnect disposed within the substrate.

Figure 1:
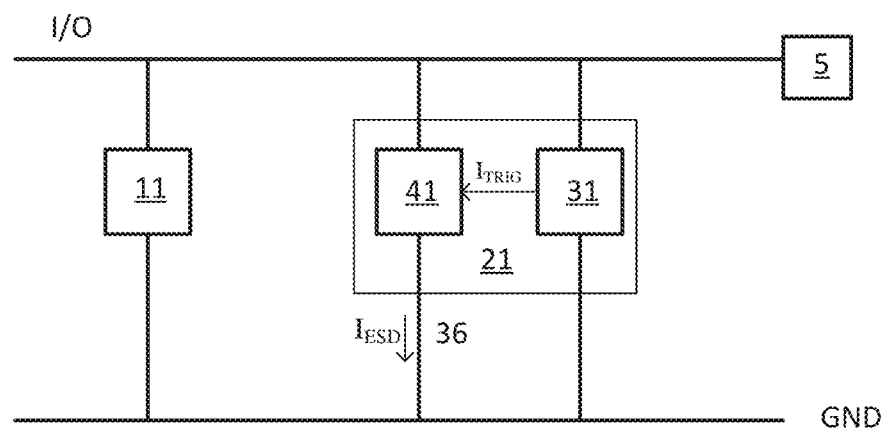
FIG. 1 is a schematic illustration of an ESD device used to protect a circuit in accordance with embodiments of the invention.

FIG. 1 will be used to describe a schematic of the protection device. Structural schematic implementation of embodiments of the invention will be described using FIG. 2 while a particular exemplary embodiment will be described using FIG. 4. FIGS. 5-9, 11-13, 15-20 describe further structural embodiments while FIGS. 10 and 14 will be used to describe a method of formation of the protection device in accordance with an embodiment of the present invention.

FIG. 1 is a schematic illustration of an ESD device used to protect a circuit in accordance with embodiments of the invention.

As illustrated in FIG. 1, the ESD device 21 is coupled in parallel to the circuitry 11 to be protected. The circuitry 11 to be protected could be any type of high speed data interface/circuit. Examples include logic, analog, mixed signal, memory, power circuits including internal buffers, drivers, and others.

Referring to FIG. 1, an ESD device 21 is triggered when an ESD pulse occurs on the pad 5. In the absence of an ESD pulse, the ESD device 21 is in the "off" position and does not conduct any current. When the pad 5 is zapped with an ESD pulse, the FSD device 21 is triggered "on" by the ESD stress voltage to conduct an ESD current from the pad to ground (substrate voltage VSS). Thus, the charge from the ESD event is dissipated through a parallel ESD circuit protecting the circuitry 11.

For effective ESD protection, the ESD device 21 must be triggered at a voltage less than the breakdown voltage of the circuitry 11 being protected. For example, in case of a MOS transistor this breakdown voltage is typically the gate oxide breakdown voltage. Hence, the ESD device 21 must turn on, within a short time, at a voltage less than the breakdown voltage to avoid destroying the circuitry 11. In addition, the holding voltage and "on" resistance of ESD device 21 will impact the robustness of the protection. A lower holding voltage and smaller resistance provide a more robust protection. However, in some conventional devices, the holding voltage may be higher than the operating voltage (VDD) of the circuitry 11 to avoid hindering its operation under normal operating conditions.

As a consequence, the ESD circuitry has to be matched with the requirements of the circuit to be protected. For example, an ESD device 21 that is to protect a high voltage device has higher triggering and holding voltages than an FSD device that is to protect a low voltage device.

However, high voltage ESD protection devices that are required to protect high voltage circuitry typically have many disadvantages. The device behavior of these large devices cannot be easily tuned to meet different individual requirements of different power components.

In various embodiments, the ESD device 21 includes a trigger element 31 coupled to a semiconductor controlled rectifier (SCR) device 41, which may be a thyristor in one embodiment. When the voltage at pad 5 is less than the threshold of the trigger device, the SCR 41 is not conducting. In the non-conducting state, the SCR 41 can be modeled as a bipolar latch that includes bipolar junction transistor (BJT) PNP device, and a BJT NPN device.

The trigger element 31 causes a trigger current $I_{TRIG}$ to flow whenever the voltage at the pad 5 exceeds a certain threshold. The presence of a trigger current $I_{TRIG}$ causes the SCR 41 to conduct a large current $I_{ESD}$ 36 even though the voltage at the pad 5 is less than the threshold voltage of the SCR 41.

Once the SCR 41 is latched, the SCR 41 can be modeled as a forward biased PIN diode. Therefore, the SCR 41 continues to stay ON ($I_{ESD}$ will continue to flow) even if $I_{TRIG}$ is no longer applied until the forward current drops below a threshold value known as the holding current.

In various embodiments, the SCR 41 comprises a vertical device while the trigger element 31 comprises a lateral device having a lateral current flow perpendicular to the current flow in the SCR 41. In various embodiments, the connection between the trigger element 31 and the SCR 41 is made using a metallic interconnect disposed within the substrate of the ESD device 21. Advantageously, the trigger element 31 is formed without any additional masks.

Figure 2A:
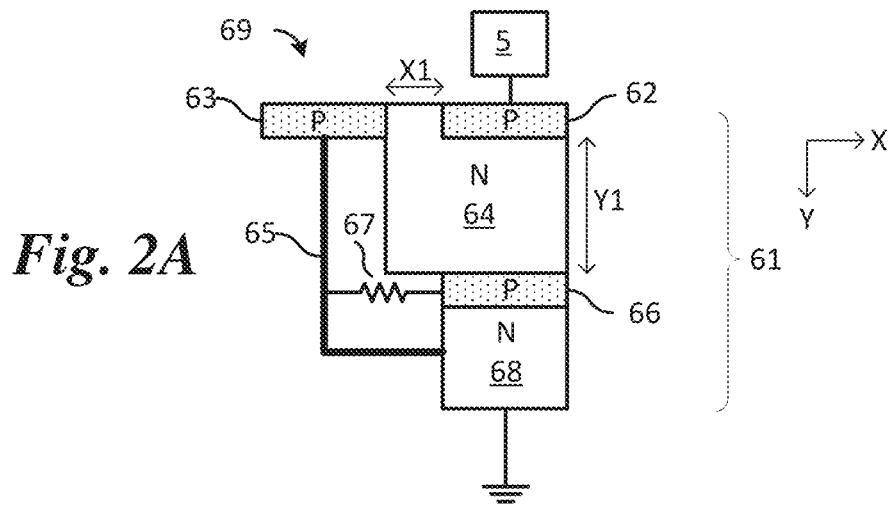
FIGS. 2A-2E illustrates an ESD device in accordance with embodiments of the present invention.

FIG. 2A illustrates an ESD device in accordance with an embodiment of the present invention.

FIG. 2A illustrates an embodiment of the present invention comprising a vertical device 61 and a lateral trigger element 69. In various embodiments, the flow of current in the vertical device 61 may comprise a vertical direction along the Y-axis while a flow of current in the lateral trigger element 69 may comprise a lateral direction along the X-axis.

In various embodiments, the lateral trigger element 69 may comprise any suitable device including a diode such as a PN diode, PIN diode, and Zener diode, a bipolar transistor, a MOS transistor, and others.

Referring to FIG. 2A, in one embodiment, a vertical device 61 comprises a SCR device, which may include a p-type anode 62, n-type cathode 68, n-type n-base SCR region 64, and p-type p-base SCR region 66. In alternative embodiments, the vertical device 61 may comprise one or more of a bipolar transistor including an insulated-gate bipolar transistor IGBT, a junction field effect transistor, a MOS field effect transistor, and other devices used for ESD, TVS, and other protection devices.

In one embodiment, the SCR device comprises a silicon based device. In alternative embodiments, the SCR device may be formed on one or more layers of gallium nitride (GaN), silicon carbide (SiC), or other wide bandgap semiconductor material. In one or more embodiments, one or more layers of the SCR device may be formed on a GaN or SiC layer disposed on a substrate. Alternatively, in another embodiment, all layers of the SCR device are formed within a GaN or SiC layer. In various embodiments, the SCR device may be formed on a hetero-epitaxial semiconductor. In alternative embodiments, a top layer may comprise a different semiconductor material, for example, to improve the response time of the lateral trigger element 69. As an illustration, the lateral trigger element 69 may be formed in a narrow band gap disposed in a wide bandgap semiconductor substrate comprising the vertical device 61.

In FIG. 2A, the lateral trigger element 69 comprises a PNP bipolar transistor comprising the p-type anode 62, a portion of the n-type n-base SCR region 64, and a p-type collector 63. In various embodiments, the p-type anode 62 and the p-type collector 63 comprise highly doped regions, for example, having a doping concentration between $10^{19}$ $cm^{-3}$ to $10^{21}$ $cm^{-3}$.

The threshold voltage or trigger voltage of the lateral trigger element 69 is controlled by the lateral width X1 and the doping of the n-type n-base SCR region 64, and the junction abruptness of the P/N junctions. Because of the lower thermal budgets along with the possible use of low energy implants to form the p-type anode 62 and the p-type collector 63, the junction abruptness of the lateral P/N junctions may be controlled independently from the doping of the vertical device 61.

Referring to FIG. 2A, in various embodiments, the p-type collector 63 is coupled to the n-type cathode 68 through an interconnection 65, which is formed through a metal connection to short the P/N junction between the p-type collector 63 and the n-type cathode 68. Thus, before the turning ON of the vertical device 61, the lateral trigger element 69 helps to discharge the initial portion of the ESD pulse or TVS surge from the pad 5 to ground.

As illustrated in FIG. 2A, the p-type collector 63 is also coupled to the p-type p-base SCR region 66 through the shunt resistor 67 and the interconnection 65. Prior to the triggering of the lateral trigger element 69, the P/N junction between the n-type n-base SCR region 64 and p-type p-base SCR region 66 is reverse biased preventing any conduction through the vertical device 61. However, the triggering of the lateral trigger element 69 due to an ESD pulse or a TVS surge pulls up the potential of the p-type base SCR region 66. Thus, the P/N junction between the n-type n-base SCR region 64 and p-type base SCR region 66 becomes forward biased causing the vertical device 61 to start conducting current. The vertical device 61 is configured to conduct much larger currents because of the large cross-sectional area available for current conduction for a given device area.

Advantageously, the vertical device 61 may be independently optimized for ESD or TVS device characteristics such as holding current, maximum discharge current without optimizing for trigger voltage and fast switching response because these functions are handled separately by the lateral trigger element 69. Advantageously, the layers of n-type n-base SCR region 64 and p-type p-base SCR region 66 may be optimized for improved performance. For example, the doping profiles of the n-type base SCR region 64 and p-type base SCR region 66 have a strong influence on the respective current gain and turn on velocity of the bases.

Figure 2B:
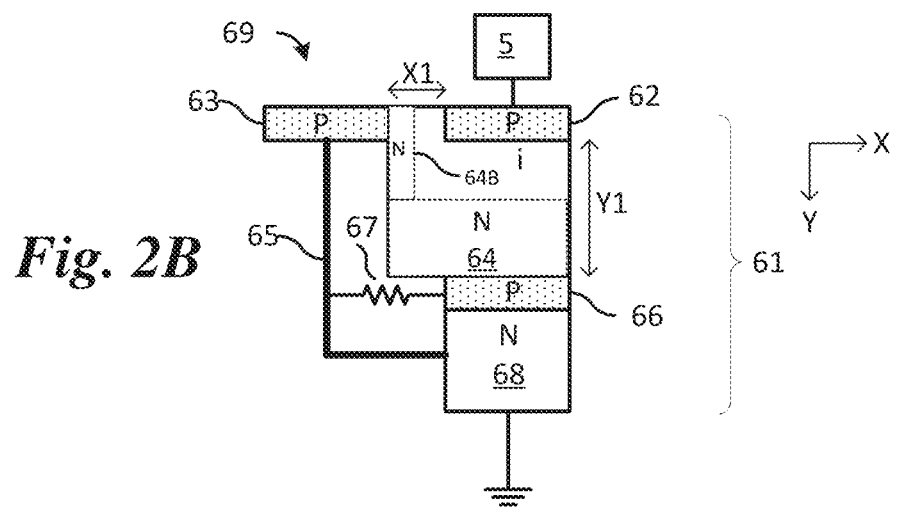
Figure 2C:
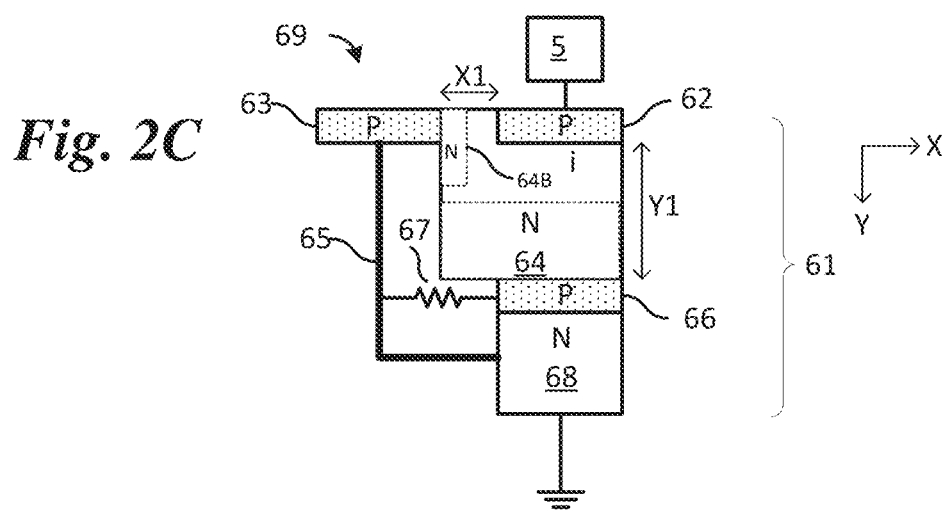

FIGS. 2B and 2C illustrate alternative embodiments comprising an additional intrinsic region.

In FIG. 2B, the lateral trigger element 69 comprises a PNP bipolar transistor comprising the p-type anode 62, a portion of an intrinsic region, an n-type vertical region 64B contacting the n-type base SCR region 64, and a p-type collector 63. FIG. 2C illustrates an alternative embodiment in which the n-type vertical region 64B does not contact the n-type base SCR region 64.

Figure 2D:
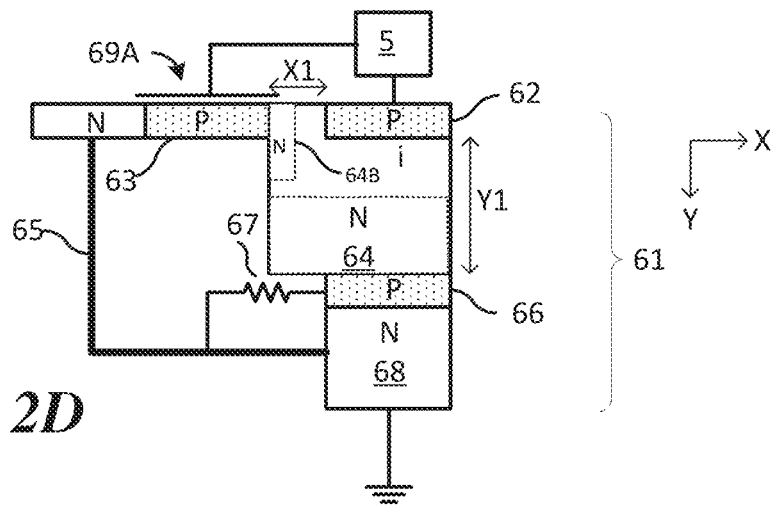

FIG. 2D illustrates an alternative embodiment comprising an additional lateral trigger element 69A comprising a MOS transistor or an IGBT 69A coupled to the output of the lateral PNP bipolar transistor. The embodiment of FIG. 2D may be combined with any of the embodiments of FIGS. 2A-2C.

Figure 2E:
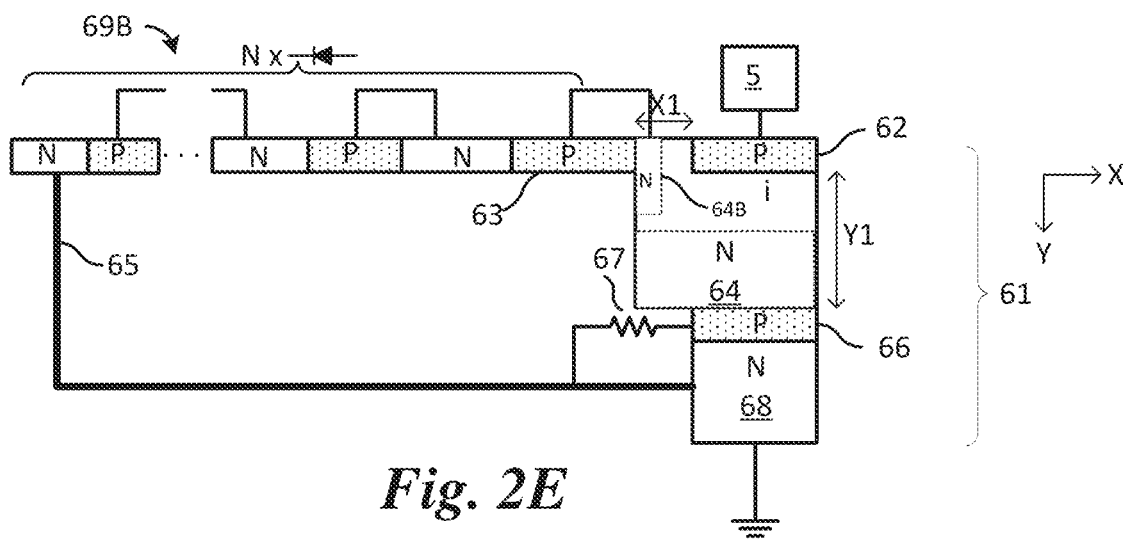

FIG. 2E illustrates an alternative embodiment comprising an additional lateral trigger element comprising a diode string 69B coupled to the output of the lateral PNP bipolar transistor. The embodiment of FIG. 2E may be combined with any of the embodiments of FIGS. 2A-2D.

Figure 3A:
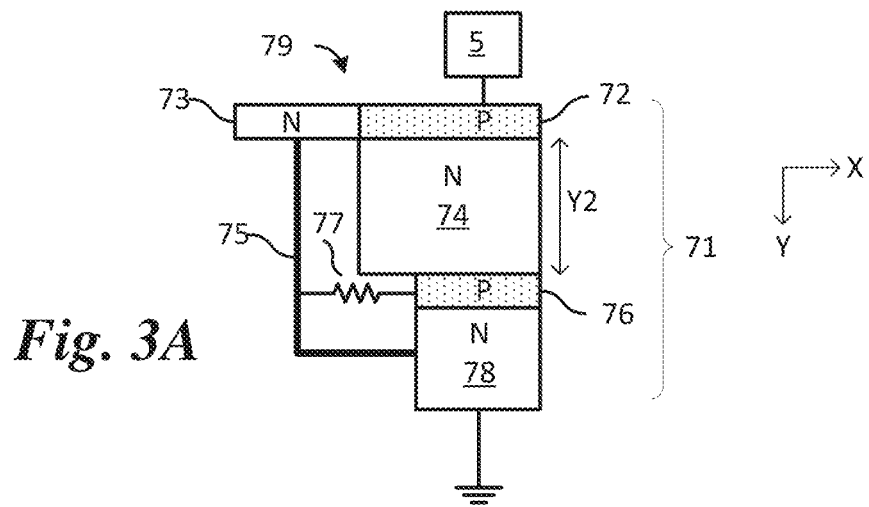
FIG. 3A illustrates a schematic cross-sectional view of a lateral trigger device coupled to trigger a vertical device in accordance with an alternative embodiment of the present invention.

FIG. 3A illustrates a schematic cross-sectional view of a lateral trigger device coupled to trigger a vertical device in accordance with an alternative embodiment of the present invention.

This embodiment illustrates a lateral diode 79 formed using a diode as an illustration. The lateral diode 79 is forward biased when a large potential is applied at the pad 5 and may be used to trigger the vertical device 71. The lateral diode 79 comprises a p-type anode 72 and an n-type cathode 78. Because of the low built-in potential of silicon diodes, which varies typically between 0.6V to 0.7V, a silicon lateral diode 79 may not be a favorable device unless a different material system is used. For example, because of the larger band gap of silicon carbide, built in potential of SiC diodes may be around 3V.

Figure 3B:
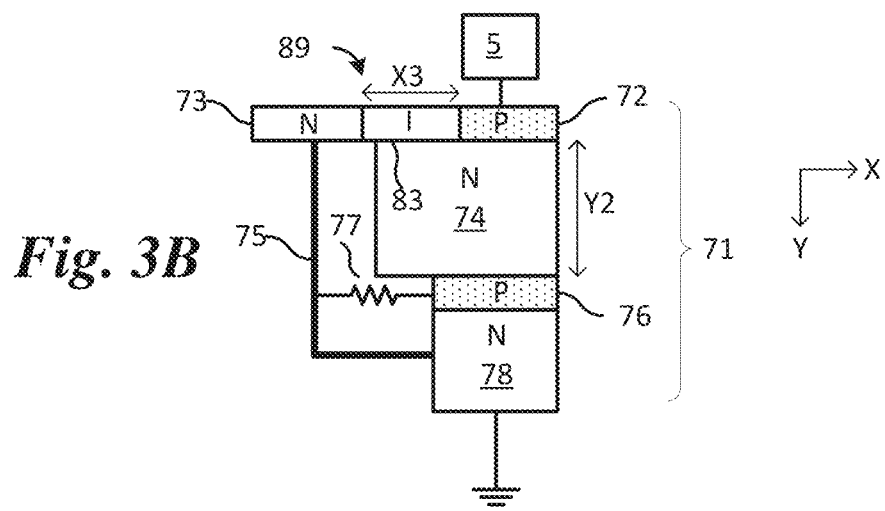
FIGS. 3B-3D illustrate schematic cross-sectional views of a lateral trigger device comprising a PIN diode coupled to trigger a vertical device in accordance with an alternative embodiment of the present invention.

FIG. 3B illustrates a schematic cross-sectional view of a lateral trigger device comprising a PIN diode coupled to trigger a vertical device in accordance with an alternative embodiment of the present invention.

The diode 79 illustrated in FIG. 3A may be easily triggered and may result in leakage currents from the pad 5 to the ground under normal operating conditions. The diode 79 may be modified in one embodiment as a PIN diode 89. The PIN diode 89 comprises a p-type anode 72, an intrinsic region 83, and an n-type cathode 78. The intrinsic region 83 or a very low doped region separates the p-type anode 72 from the n-type cathode 73 by a third distance X3 that can be easily controlled during processing.

Figure 3C:
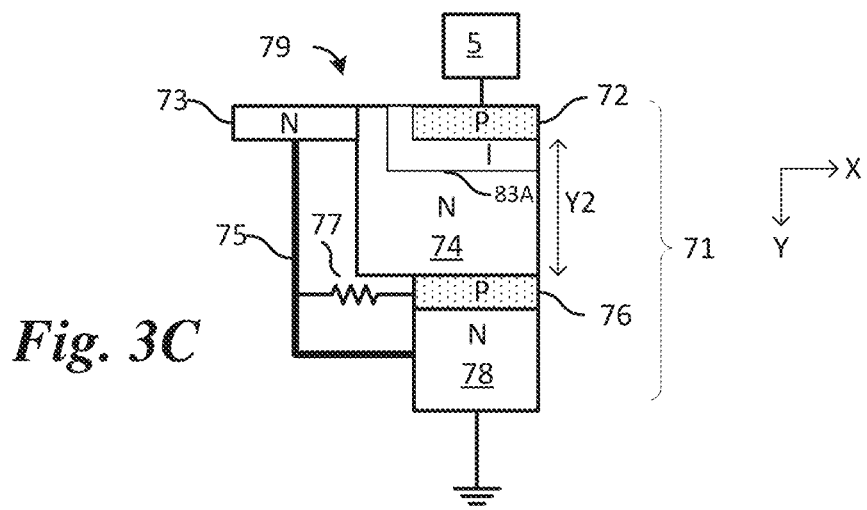

FIG. 3C illustrates a schematic cross-sectional view of a lateral trigger device comprising a PIN diode coupled to trigger a vertical device in accordance with an alternative embodiment of the present invention.

In this embodiment, an intrinsic region 83A extends between the p-type anode 72 and the n-type cathode 73 of the PIN diode as well as between the p-type anode 72 and the n-type base SCR region 74. A portion of the n-type base SCR region 74 also extends between the p-type anode 72 and the n-type cathode 73 of the PIN diode.

Figure 3D:
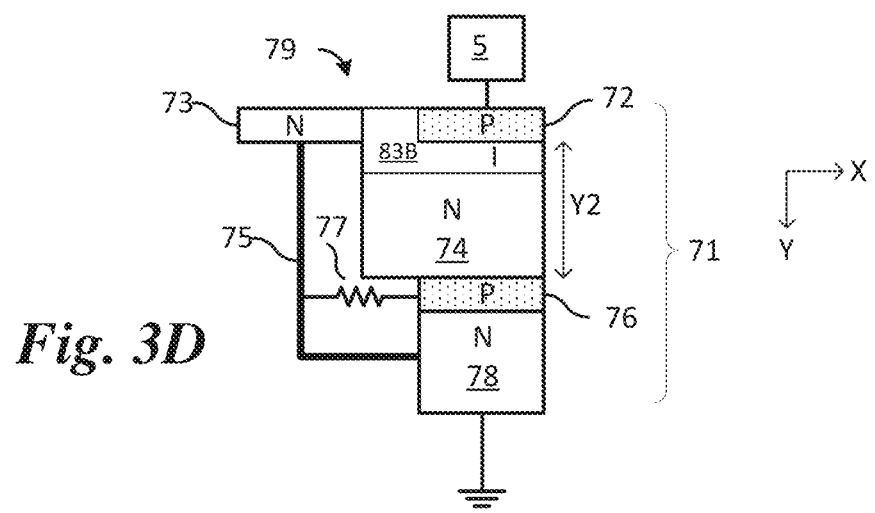

FIG. 3D illustrates a schematic cross-sectional view of a lateral trigger device comprising a PIN diode coupled to trigger a vertical device in accordance with an alternative embodiment of the present invention.

In this embodiment, an intrinsic region 83B extends completely between the p-type anode 72 and the n-type cathode 73 of the PIN diode. Similar to the prior embodiment, the intrinsic region 83B is disposed between the p-type anode 72 and the n-type base SCR region 74.

Figure 4A:
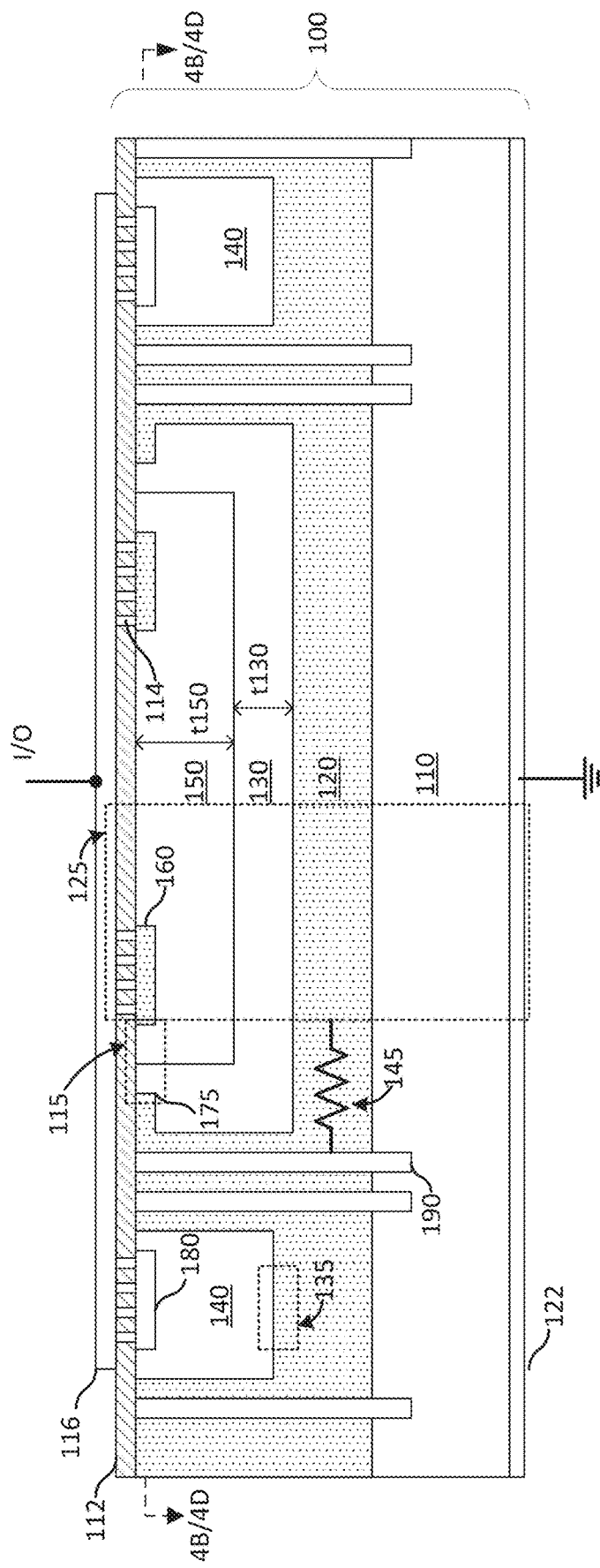
Figure 4B:
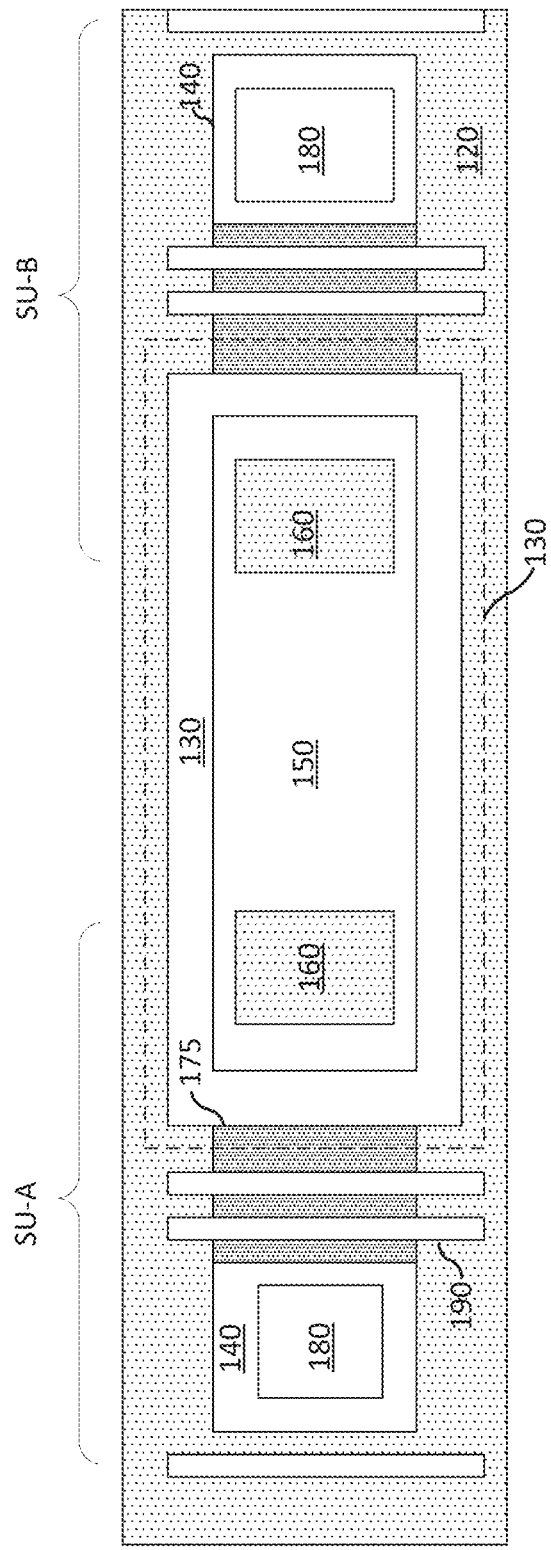
Figure 4C:
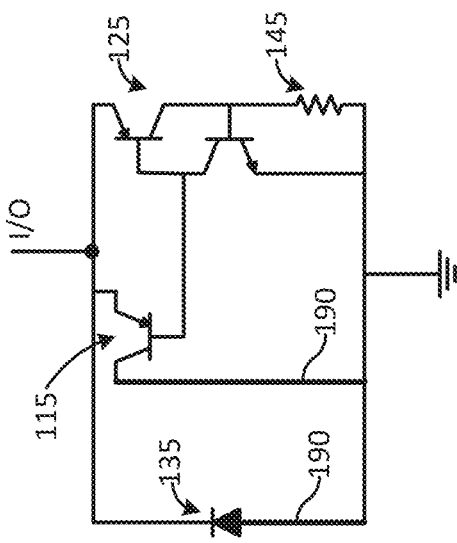
FIG. 4C illustrates a corresponding circuit schematic.
Figure 4D:
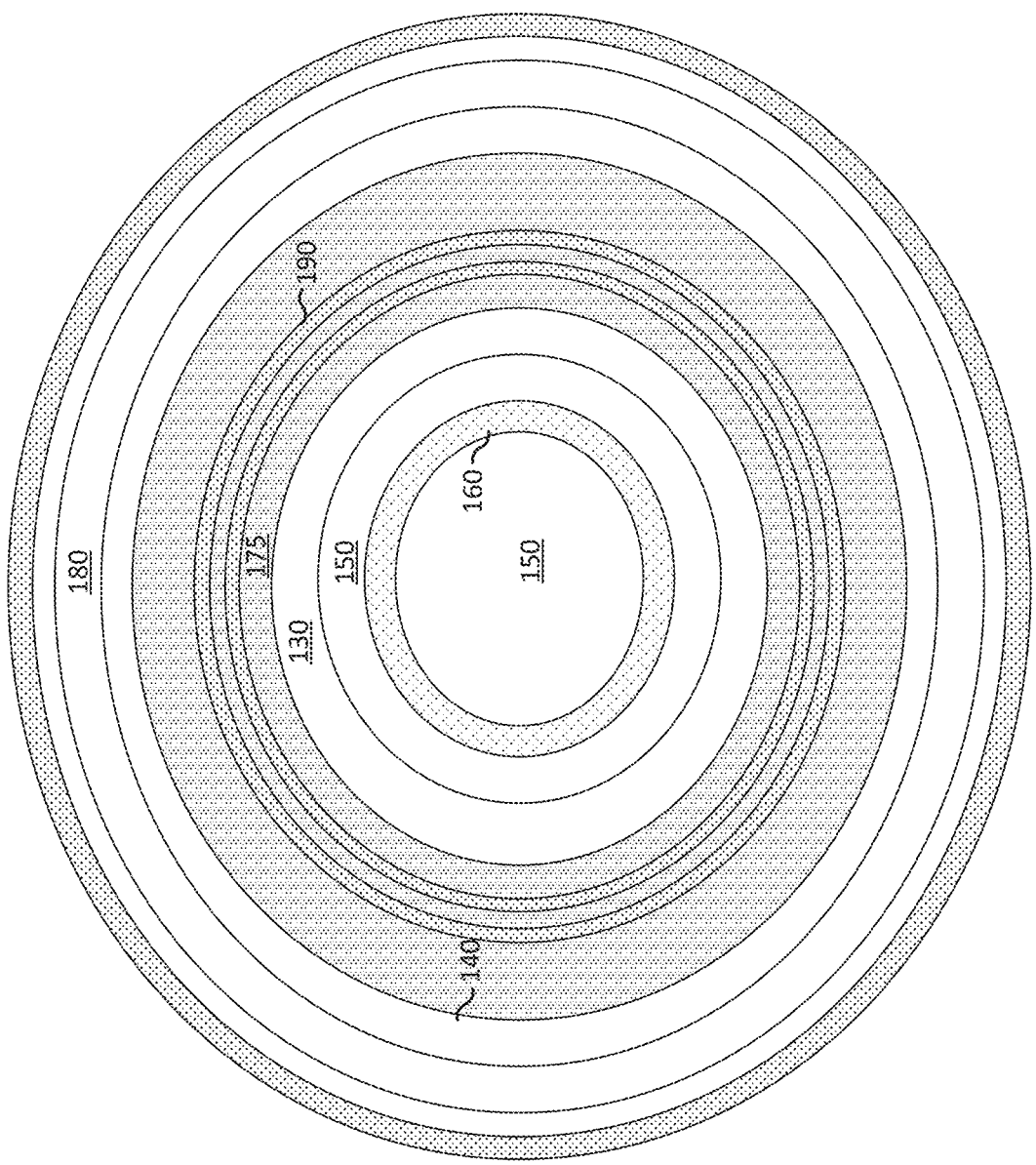

FIG. 4A illustrates a cross-sectional view of an embodiment of an ESD protection device comprising a vertical device and a lateral trigger element. FIG. 4B illustrates a possible top schematic view of ESD protection device in one embodiment, FIG. 4C illustrates a corresponding circuit schematic, FIG. 4D illustrates an alternative possible top schematic view of ESD protection device in one embodiment.

Referring to FIG. 4A, the ESD protection device comprises a vertical device 125, a lateral trigger element 115, and a blocking diode 135 formed within a substrate.

The substrate 100 may include one or more epitaxial layers and may comprise silicon, gallium nitride, silicon carbide, or other wide bandgap semiconductor materials in various embodiments. The substrate 100 may comprise one or more epitaxial layers including one or more hetero epitaxial layers in various embodiments.

In various embodiments, the substrate 100 may comprise a p-type or n-type doping.

A first doped region 120 is disposed in the substrate 100 leaving a remaining substrate 110, which is the substrate 100 remaining after back side thinning and metallization. The first doped region 120 may be a large well region 1n one embodiment (see also FIGS. 4B and 4D) or may be a buried layer in some embodiments. In various embodiments, the first doped region 120 has the opposite doping type from the remaining substrate 110. For example, if the remaining substrate 110 has a first doping type, then the first doped region 120 has the second doping type, which is opposite to the first doping type. The remaining substrate 110 may comprise a high doping, for example, between $10^{18}$ cm$^{-3}$ to $9\times10^{19}$ cm$^{-3}$ in one embodiment.

A second doped region 130 is disposed in the first doped region 120. The second doped region 130 may be formed as a well region 1n one or more embodiments. In one or more embodiments, the second doped region 130 may be about 1 μm to about 5 Alternatively, the second doped region 130 may be between 1 μm to 3 μm. In one or more embodiments, the second doped region 130 may have a doping concentration of $10^{15}$ cm$^{-3}$ to $10^{19}$ cm$^{-3}$, and $10^{17}$ cm$^{-3}$ to $10^{18}$ cm$^{-3}$ in one embodiment.

Referring to FIG. 4A, the third doped region 150 is disposed within the second doped region 130. The third doped region 150 may have the same doping type as the second doped region 130. Alternatively, in some embodiments, the third doped region 150 may also have a different doping type as the second doped region 130. However, the third doped region 150 has a lower conductivity than the second doped region 130. Accordingly, the third doped region 150 may be doped to a lower doping than the second doped region 130 in one embodiment. Further in some embodiments, the third doped region 150 may be even intrinsic. In one or more embodiments, the third doped region 150 may have a doping concentration of $10^{12}$ cm$^{-3}$ to $10^{19}$ cm$^{-3}$. Alternatively, the third doped region 150 may have a doping between $10^{12}$ cm$^{-3}$ to $10^{14}$ cm$^{-3}$, $10^{14}$ cm$^{-3}$ to $10^{16}$ cm$^{-3}$, or $10^{16}$ cm$^{-3}$ to $10^{18}$ cm$^{-3}$ in various embodiments. In one or more embodiments, the third doped region 150 has a vertical thickness t150 that is about 1 μm to 8 μm, and the vertical thickness t130 of the second doped region 130 is about 0.1 μm to 3 μm.

A fourth doped region 140 is disposed adjacent to the second doped region 130 and separated by a portion of the first doped region 120. The fourth doped region 140 may have the same doping as the second doped region 130 in one embodiment. Alternatively, in another embodiment, the fourth doped region 140 may have a different doping as the second doped region 130. In various embodiments, the fourth doped region 140 may be a low doped region and, in one embodiment, may be have doping similar to the third doped region 150.

One or more of a fifth doped region 160 is disposed in the third doped region 150 and forms a p/n junction with the third doped region 150 because the fifth doped region 160 has the opposite doping to the third doped region 150. The fifth doped region 160 is coupled to a metal interconnect layer 116 through interconnects 114 disposed in an overlying insulating layer 112.

In one or more embodiments, the fifth doped region 160 has a vertical thickness that is 5% to 50% of the vertical thickness t150 of the third doped region 150. For example, in one embodiment, the vertical thickness of the fifth doped region 160 ranges from 20% to 40% of the vertical thickness of the third doped region 150. For example, in one embodiment, the vertical thickness of the fifth doped region 160 ranges from 0.02 µm to 0.05 µm. In various embodiments, the fifth doped region 160 is a heavily doped region and comprises a peak doping concentration of at least $10^{19}$ cm$^{-3}$, and about 10-9 cm$^{-3}$ to $10^{21}$ cm$^{-3}$ in one embodiment.

A passivation layer and one or more contact pads may be formed over the metal interconnect layer 116 as needed in one or more embodiments.

A sixth doped region 180 is disposed in the fourth doped region 140 and has the same doping as the fourth doped region 140. In one embodiment, the fifth doped region 160 and the sixth doped region 180 are formed using different masking steps and therefore different implant processes. The fifth doped region 160 is also coupled through interconnects 114 to the metal interconnect layer 116. Therefore, the fifth doped region 160 is coupled to the sixth doped region 180, which are both coupled to a node to be protected (e.g., pad 5 in FIG. 1).

A seventh doped region 175 extends from the first doped region 120 towards the fifth doped region 160. The seventh doped region 175 has the same doping type as the fifth doped region 160, and may be formed in a same mask step as the fifth doped region 160.

As an illustration, in one embodiment, the remaining substrate 110 has an n-type doping, the first doped region 120 has a p-type doping, the second doped region 130, the third doped region 150, the fourth doped region 140, and the sixth doped region 180 have a n-type doping. The fifth doped region 160 and the seventh doped region 175 have a p-type doping.

A back side metal layer 122 is disposed under the remaining substrate 110 and is coupled to a reference potential such as ground. The back side metal layer 122 may be coupled to the remaining substrate 110 through a silicide layer in some embodiments. The back side metal layer 122 may comprise a metal nitride layer such as titanium nitride (TiN), copper layer (Cu), gold tin (AuSn), gold silver (AuAg), or aluminum layer (Al) in various embodiments.

A plurality of conductive interconnects 190 are formed within the substrate 100. Only for illustration, two conductive interconnects 190 are shown in FIG. 4A and other figures. In various embodiments, less (just one) or more number of conductive interconnects 190 may be formed. In one or more embodiments, the plurality of conductive interconnects 190 are disposed in the first doped region 120. Further, the plurality of conductive interconnects 190 extend beyond the first doped region 120 and into the remaining substrate 110.

In one or more embodiments, the plurality of conductive interconnects 190 comprises a metallic layer so as to form a Schottky contact with the remaining substrate 110. The plurality of conductive interconnects 190 may comprise copper, titanium, silicide, tantalum, tungsten and other metallic materials in various embodiments. The plurality of conductive interconnects 190 may also comprise conductive metal nitrides and metal silicide as examples. The plurality of conductive interconnects 190 may comprise a conductive form of carbon such as graphene in one or more embodiments.

The plurality of conductive interconnects 190 may include sidewall insulation layers or spacers to avoid shorting the metallic material in the plurality of conductive interconnects 190 with one or more layers. Thus, doped regions contacting the plurality of conductive interconnects 190 are electrically shorted to the remaining substrate 110.

It is noted that although FIG. 4B illustrates two symmetric devices, subunit A (SU-A) and subunit B (SU-B), embodiments of the present invention may include just a single unit, for example, the left portion (SU-A) or right portion (SU-B). See also FIG. 2 showing this embodiment in a simpler schematic representation.

FIG. 4D illustrates an alternative possible top schematic view of ESD protection device in one embodiment. Unlike FIG. 4B, this embodiment illustrates a circular device structure.

Accordingly, as also illustrated in FIG. 4C, the device in FIG. 4A includes a diode 135 formed between the first doped region 120 and the fourth doped region 140. The cathode of the diode 135 is coupled to the I/O node to be protected while the anode of the diode 135 is coupled to equipotential through the plurality of conductive interconnects 190. In the absence of the plurality of conductive interconnects 190, the diode 135 is coupled to the remaining substrate 110 through another p/n junction so as to form a bipolar transistor. In contrast, by using the plurality of conductive interconnects 190, a diode 135 is realized in the circuit.

In one illustrative embodiment, the vertical device 125 comprises an n-type remaining substrate 110, a p-type first doped region 120, an n-type second doped region 130, a low doped n-type (n$^-$) third doped region 150, an n-type (n$^-$) fourth doped region 140, a p-type (p$^+$) fifth doped region 160, a n-type (n$^+$) sixth doped region 180, a p-type (p$^+$) seventh doped region 175. In an alternative embodiment, the doping types may be reversed. Additionally in an alternative embodiment, the low doped n-type third doped region 150 and the n-type fourth doped region 140 are created by epitaxial growth and have the same doping.

Further, referring to FIG. 4C along with FIG. 4A, the vertical device 125 comprises a thyristor comprising a first bipolar transistor formed between the remaining substrate 110, the first doped region 120, and the second doped region 130, and a second bipolar transistor formed between the first doped region 120, the second doped region 130 and the third doped region 150, and the fifth doped region 160.

The lateral trigger element 115 is formed by the bipolar transistor formed between the fifth doped region 160 and the seventh doped region 175. The second doped region 130 and the third doped region 150 form the base regions of the bipolar transistor forming the lateral trigger element 115. The seventh doped region 175 of the lateral trigger element 115, which forms a terminal of the seventh doped region 175 of the lateral trigger element 115 (circuit element in FIG. 4C), is coupled to the remaining substrate 110 through one or more of the plurality of conductive interconnects 190. Further, the seventh doped region 175 is coupled to a trigger input element of the vertical device 125 through a portion of the first doped region 120 having a resistance of a resistor 145.

Advantageously, the first doped region 120, the second doped region 130, and the third doped region 150, that form the SCR device can be independently optimized or varied without changing the lateral trigger element 115. Further, the seventh doped region 175 may be independently varied without impacting the layers of the SCR. Thus, using embodiments of the present invention, the lateral trigger element 115 may be optimized independently while the vertical device 125 may be optimized independently. For example, the seventh doped region 175 may be optimized to produce a sharp p/n junction with the second doped region 130 so as to reduce the trigger voltage and faster switching time of the lateral trigger element 115. Alternatively, the layout of the seventh doped region 175 may be changed by bringing it closer to the fifth doped region 160. In particular, abrupt junctions may be formed laterally more easily than vertical junctions. For example, very sharp lateral junctions can be formed using implantation and anneal processes especially for shallow regions such as the fifth doped region 160.

Figure 5:
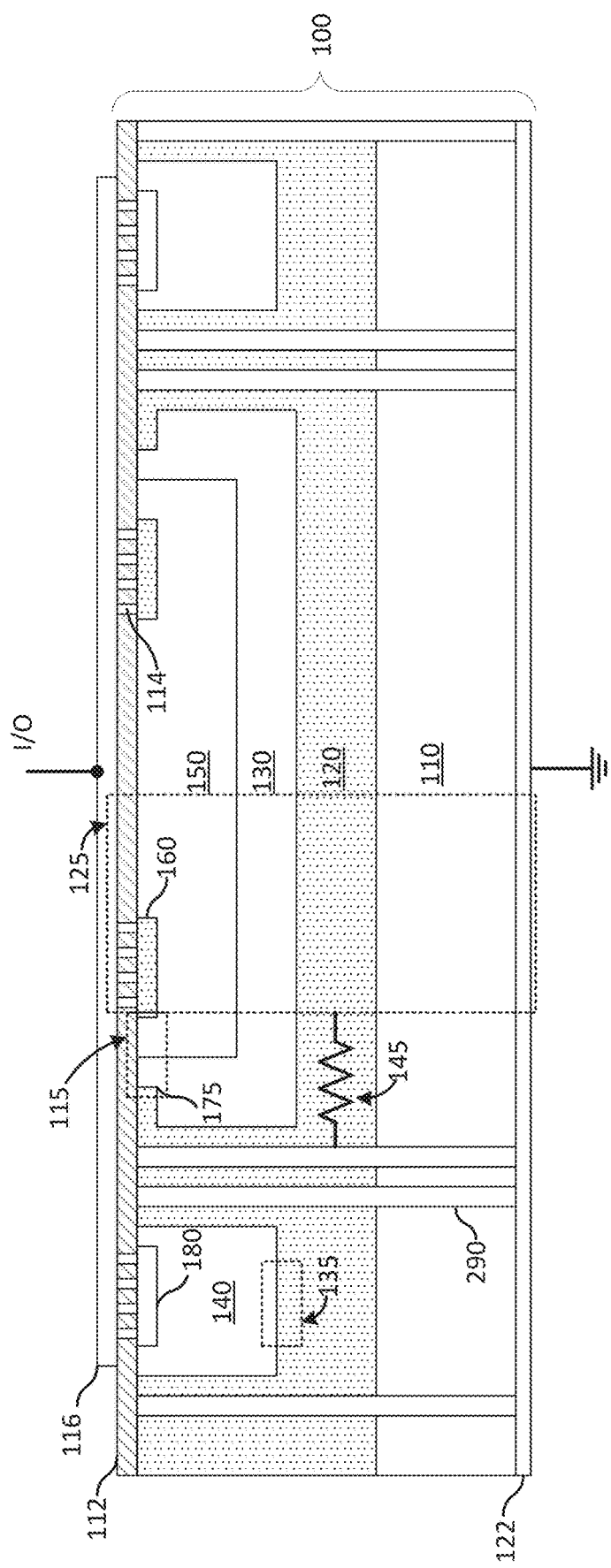
FIG. 5 illustrates a cross-sectional view of an alternative embodiment of an ESD protection device comprising a vertical device and a lateral trigger element in which the lateral trigger element is coupled to the back side metallization by through substrate interconnects.

FIG. 5 illustrates a cross-sectional view of an alternative embodiment of an ESD protection device comprising a vertical device and a lateral trigger element in which the lateral trigger element is coupled to the back side metallization by through substrate interconnects.

Unlike the prior embodiment, in this embodiment, interconnects extend through the substrate 100 as a through substrate interconnect 290. Thus, in this embodiment, no additional resistance is introduced between the lateral trigger element 115 and the back side metallization (back side metal layer 122).

Figure 6A:
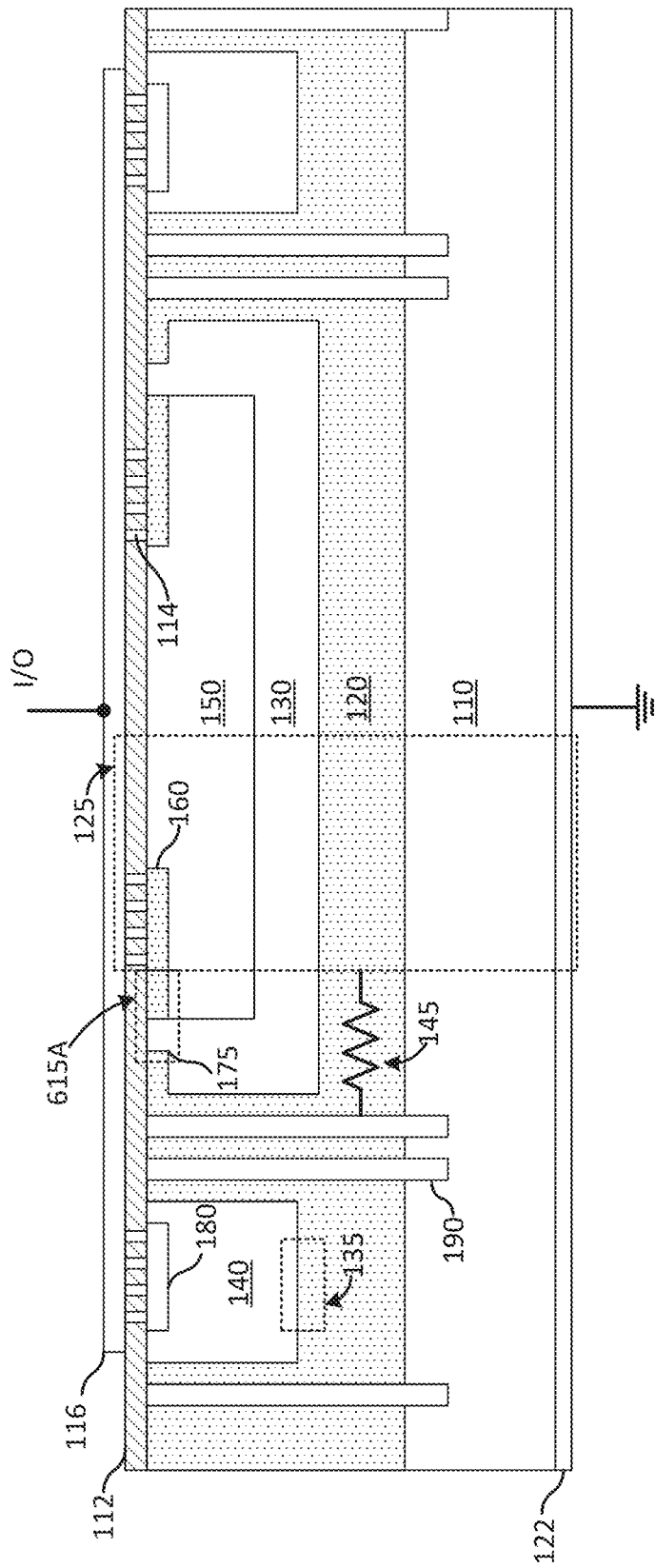
FIGS. 6A and 6B illustrates cross-sectional views of alternative embodiments of an ESD protection device comprising a vertical device and a lateral trigger element in which the lateral location of the doped regions is modified to improve the lateral trigger element.
Figure 6B:
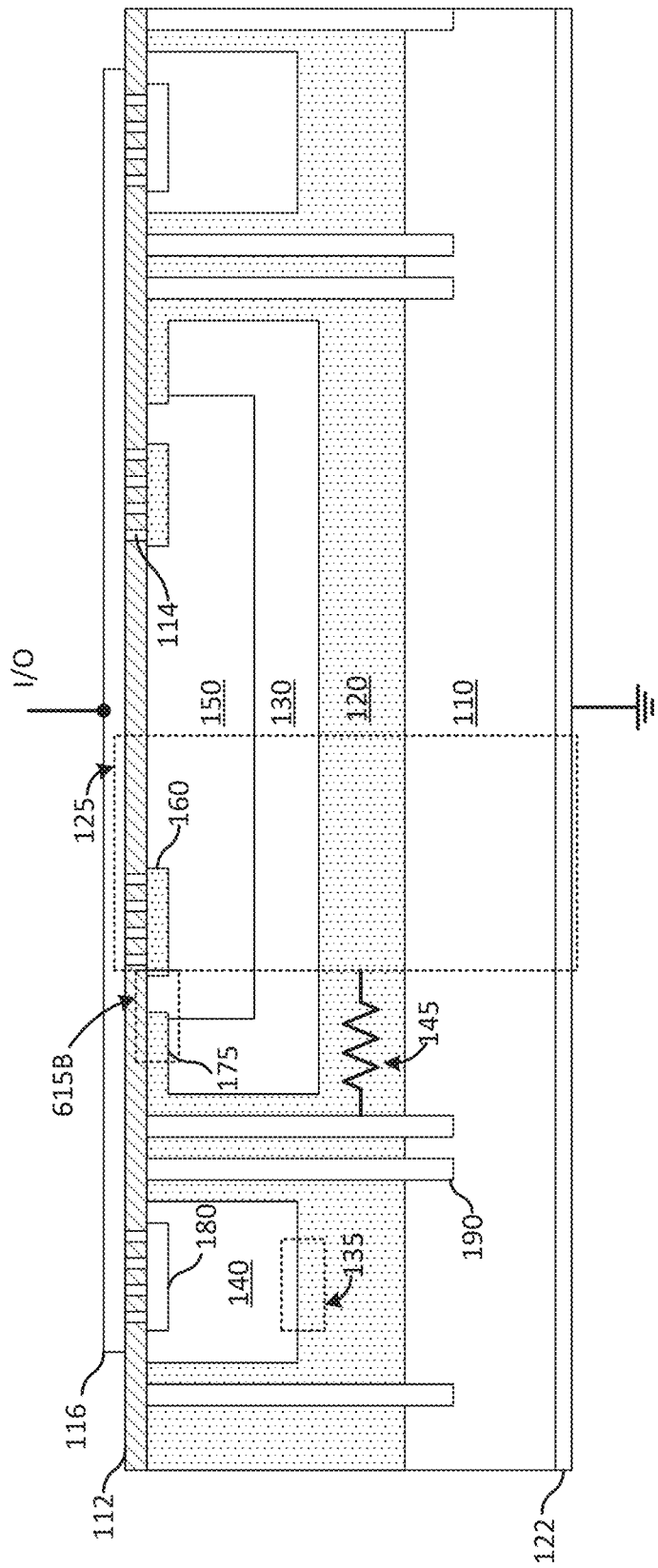

FIGS. 6A and 6B illustrates cross-sectional views of alternative embodiments of an ESD protection device comprising a vertical device and a lateral trigger element in which the lateral location of the doped regions is modified to improve the lateral trigger element.

Similar to prior embodiments, interconnects 190 are formed to contact the substrate 100. Alternatively, in one implementation of this embodiment may include the through substrate interconnects 290 in which the lateral trigger element (labeled as 615A in FIGS. 6A and 615B in FIG. 6B) is coupled to the back side metal layer 122 by through substrate interconnects 290.

Further, the layout of the fifth doped region 160 and the seventh doped region 175 may be changed. For example, in FIG. 6A, the fifth doped region 160 may be laterally extended towards the seventh doped region 175 in one illustration. In another example, in FIG. 6B, the seventh doped region 175 may be extended towards the fifth doped region 160.

Figure 7A:
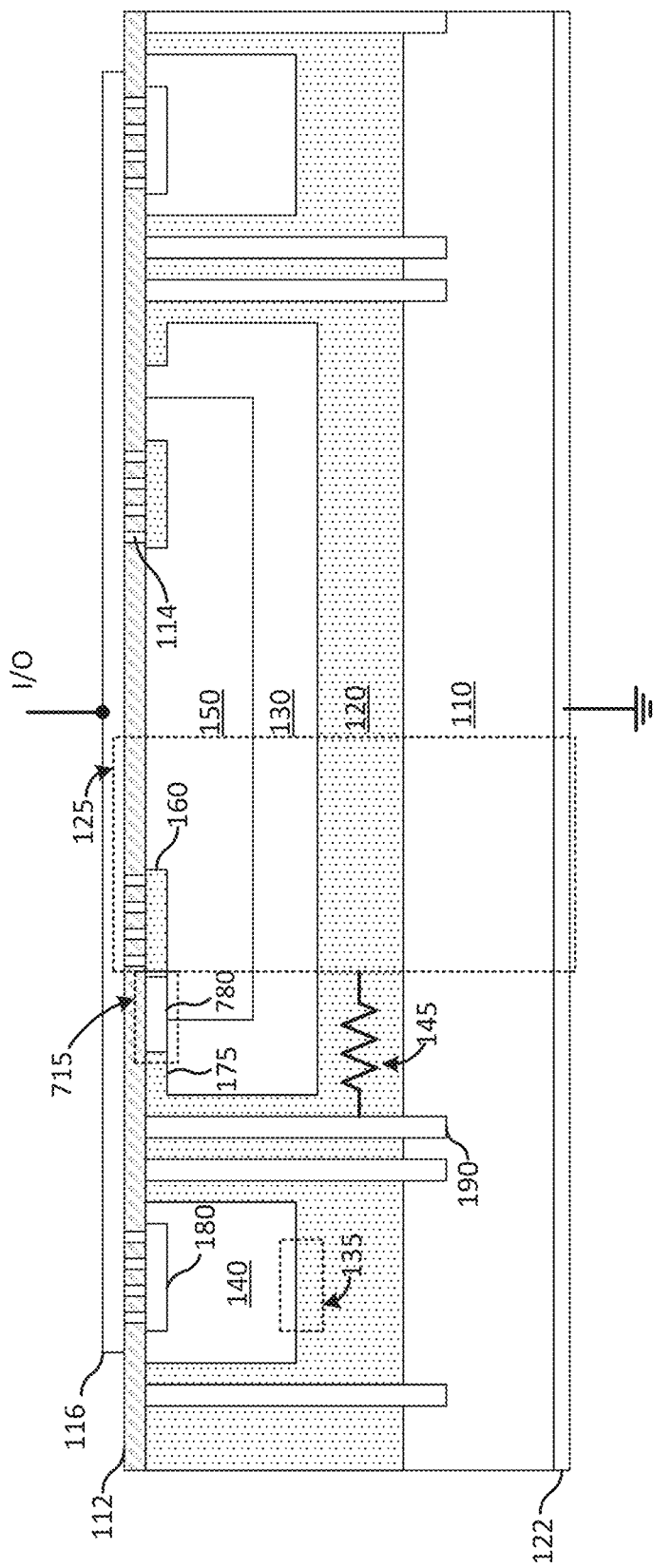

FIG. 7A illustrates a cross-sectional view of an alternative embodiment of an ESD protection device comprising a vertical device and a lateral trigger element in which the base region of the lateral trigger element is formed separately.

As a further illustration of the optimization of the lateral trigger element, the base region 780 of the lateral trigger element 115 may be formed independently, for example, using an implantation process. Thus, the counter-doping of the base region 780 may be controlled without changing any of the parameters of the SCR device (vertical device 125).

Figure 7B:
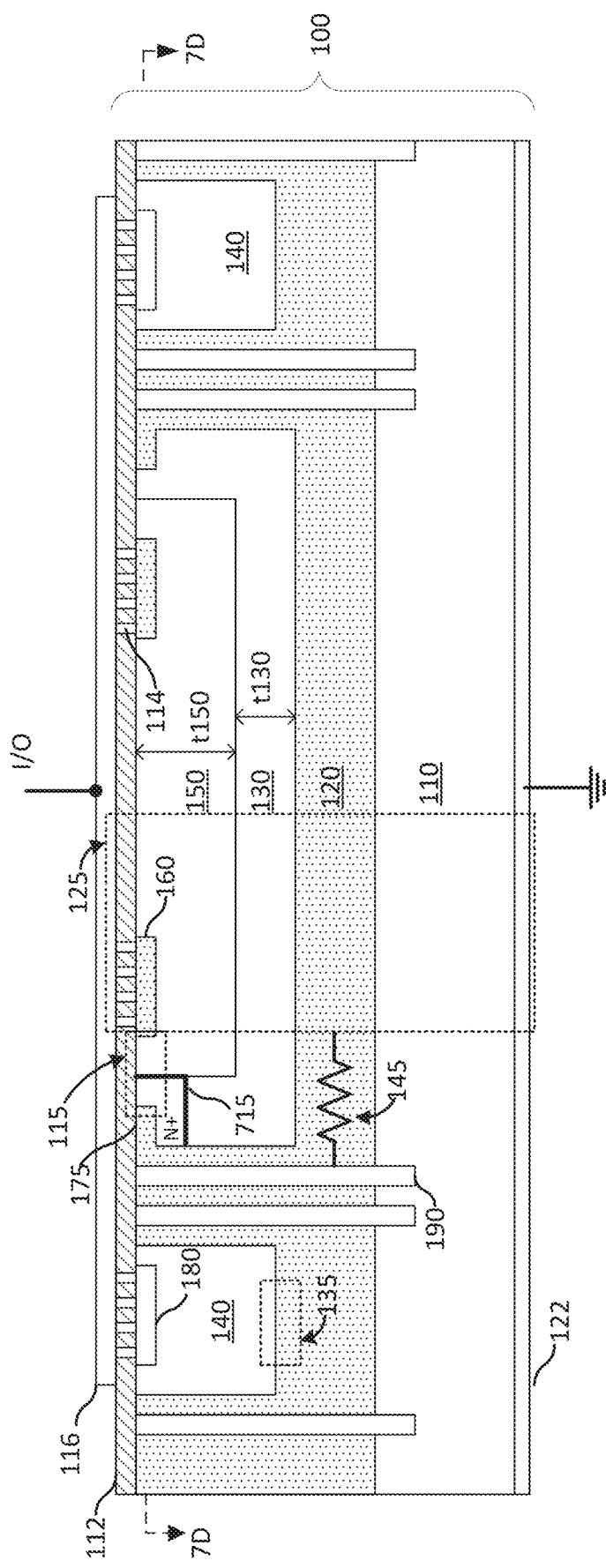
Figure 7C:
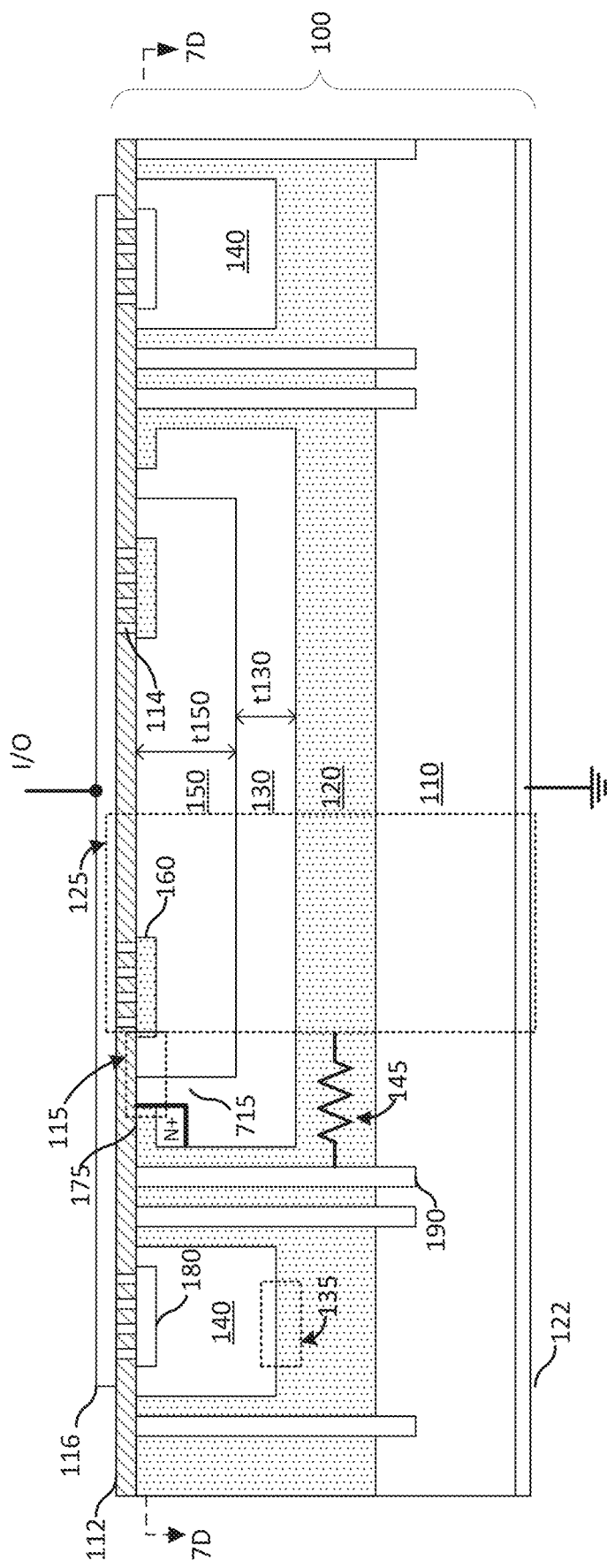

FIG. 7B-7C illustrates cross-sectional views of another alternative embodiment of an ESD protection device comprising a vertical device and a lateral trigger element in which the base region of the lateral trigger element is formed separately. As illustrated in different embodiments, an N+ implant region 715 may be formed to have different profiles. For example, in one embodiment, the N+ implant region 715 may be roughly aligned with the interface between the second doped region 130 and the third doped region 150. In another embodiment illustrated in FIG. 7C, the implant region 715 is aligned with the seventh doped region 175.

Figure 7D:
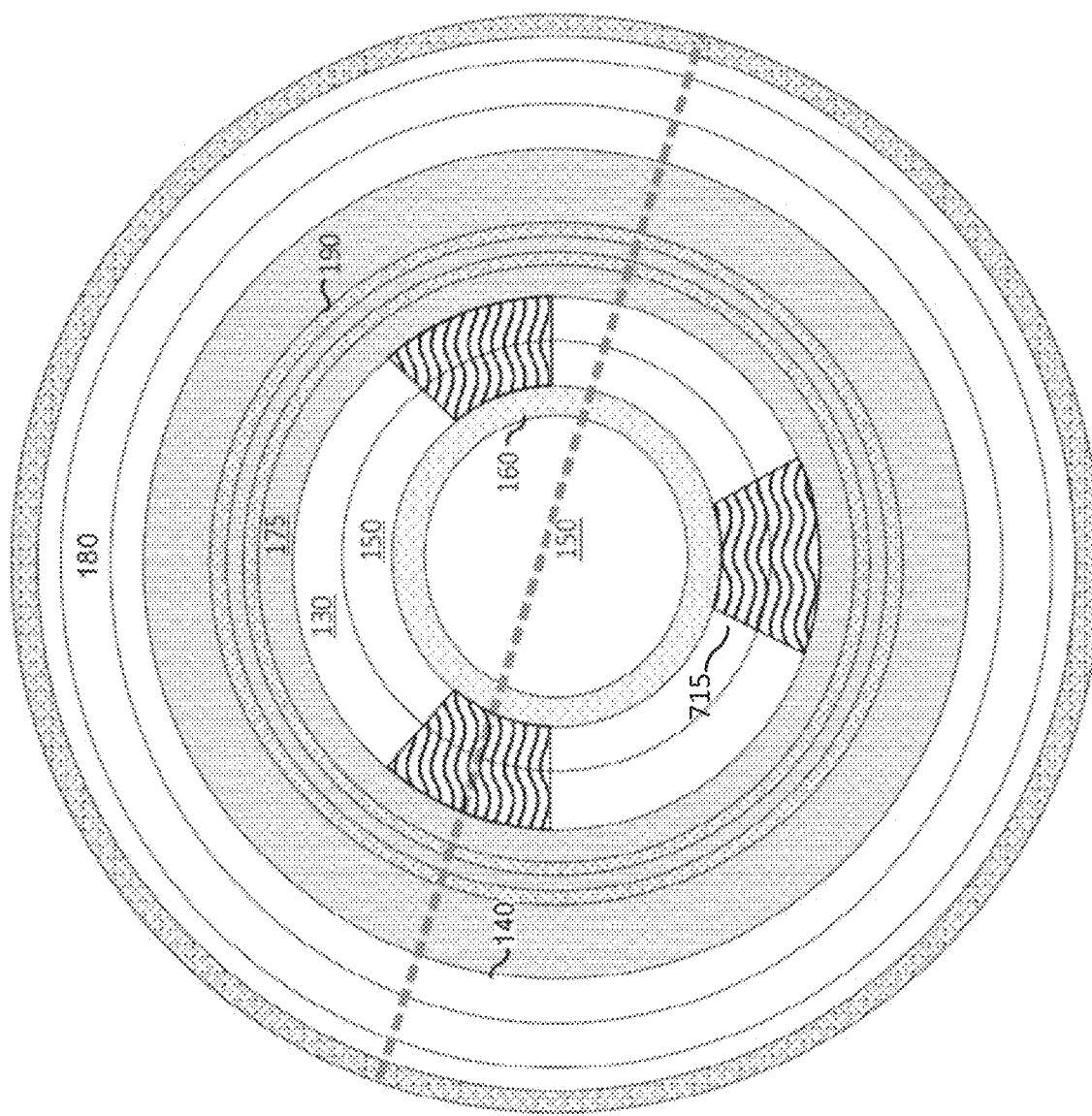

FIG. 7D illustrates a top view of the alternative embodiments described in FIGS. 7A-7C. As is now clear, the location of the implant region 715 (base region 780 in FIG. 7A) are implanted and therefore enables the formation of structures that appear asymmetric in the cross sectional views.

Figure 8A:
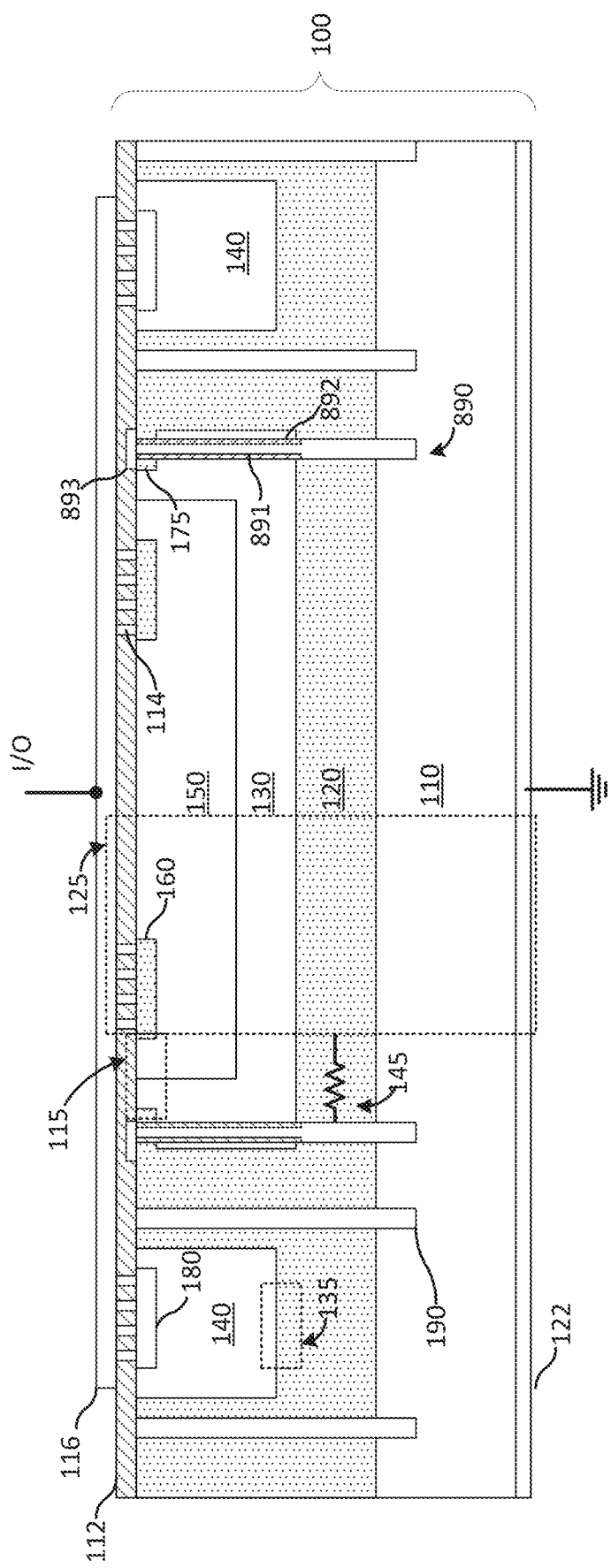
FIGS. 8A-8C illustrates cross-sectional views of an alternative embodiment of an ESD protection device comprising a vertical device and a lateral trigger element in which the plurality of interconnects are formed through counter doped regions.
Figure 8B:
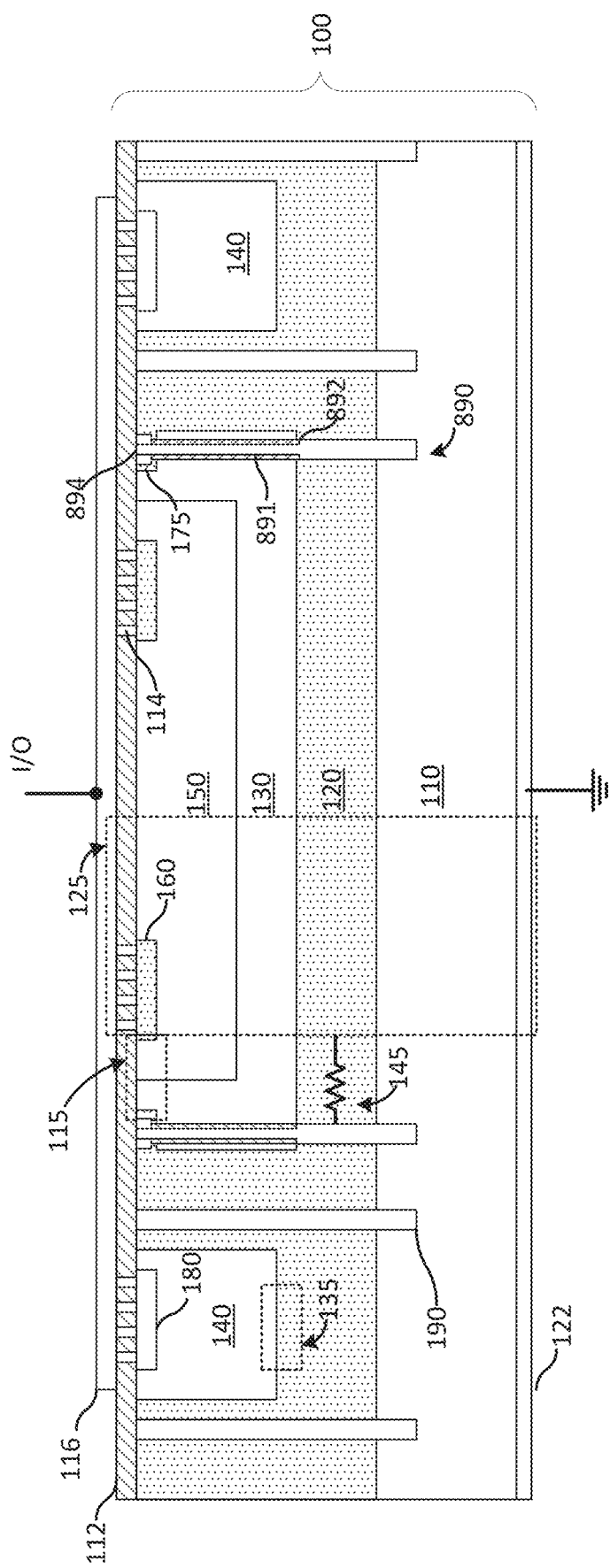
Figure 8C:
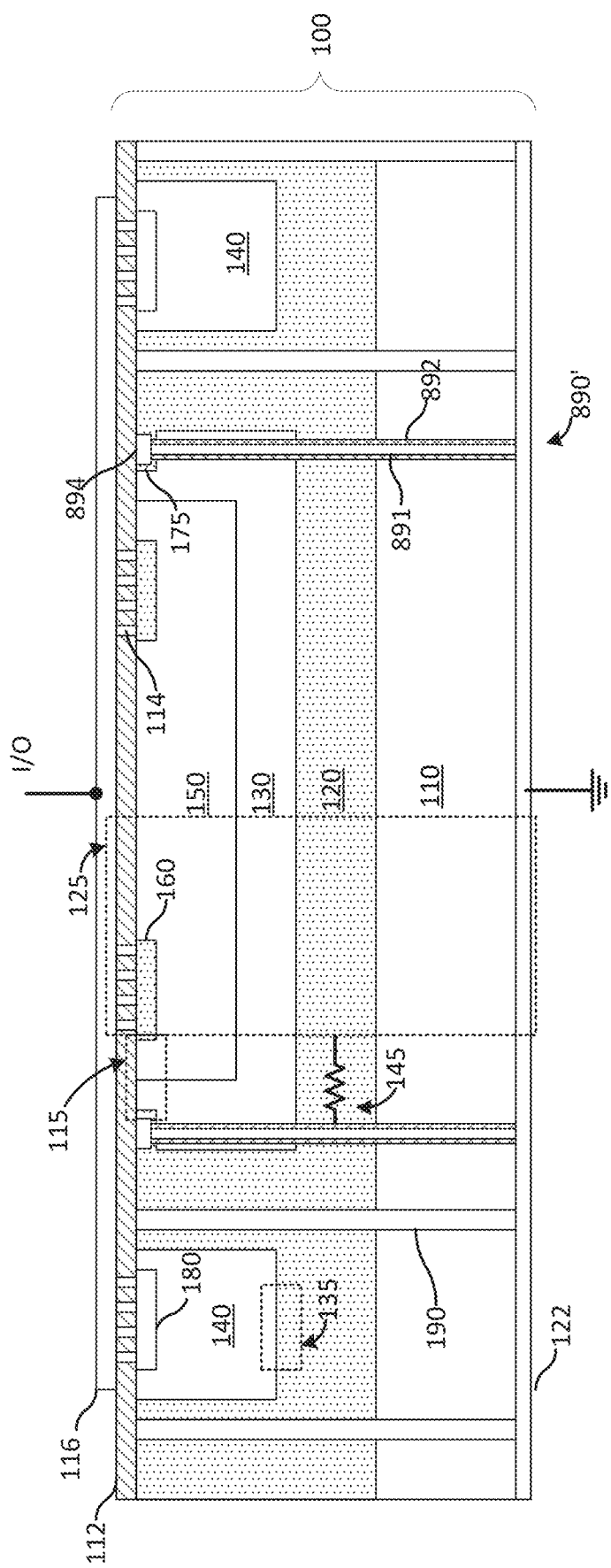

FIGS. 8A-8C illustrates cross-sectional views of an alternative embodiment of an ESD protection device comprising a vertical device and a lateral trigger element in which the plurality of interconnects are formed through counter doped regions.

However, as illustrated in FIG. 8A, the plurality of interconnects 890 include an insulating spacer layer 892 to avoid shorting the metallic material 891 with the second doped region 130 and the first doped region 120. However, the metallic material 891 has to be contacted with the seventh doped region 175, which, in one embodiment, may be made above the substrate 100, e.g., using metal contact 893.

Alternatively, in another embodiment as illustrated in FIG. 8B, the metallic material 891 is contacted with the seventh doped region 175 by etching a larger contact via within the seventh doped region 175 after forming the insulating spacer layer 892 but prior to filling the metallic material 891. Thus, the metallic material 891 may be filled within the larger opening 894 forming a lower resistance contact with the seventh doped region 175. In some embodiments, the insulating spacer layer 892 may not be formed in the lower part of the trench to enable the shorting of the p/n diode formed between the remaining substrate 110 and the first doped region 120. In alternative embodiments, the insulating spacer layer 892 may be a counter doped region as will also be described using FIG. 17.

Although in FIG. 8B, only some of the interconnects include an insulating spacer layer 892, in other embodiments, all the interconnects 190 and the interconnects 890 may include such an insulating spacer layer 892.

FIG. 8C illustrates an alternative embodiment in which the interconnects are formed as through substrate vias and include an insulating spacer layer.

Figure 9:
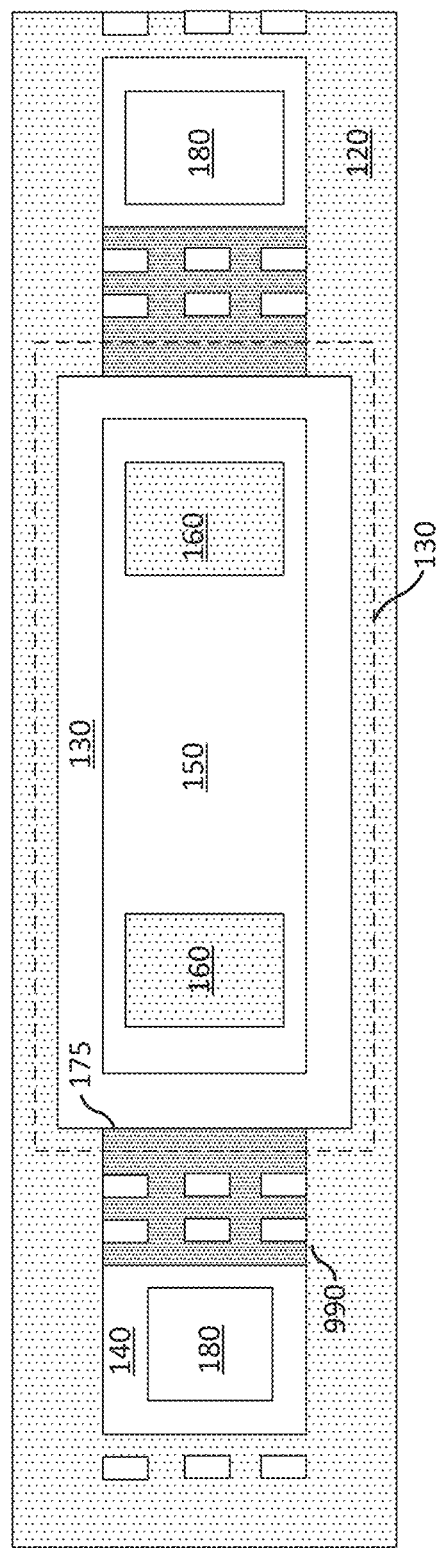
FIG. 9 illustrates a top sectional view of an alternative embodiment of an ESD protection device comprising a vertical device and a lateral trigger element in which the interconnects are formed as vias.

FIG. 9 illustrates a top sectional view of an alternative embodiment of an ESD protection device comprising a vertical device and a lateral trigger element in which the interconnects are formed as holes or vias.

Unlike FIG. 4B or 4D illustrating interconnects 190 formed as trenches (continuously), in this embodiment, interconnects are patterned as contacts thereby forming a plurality of vias 990. As described in prior embodiment, the plurality of vias 990 may be through substrate vias extending completely through the substrate 100 or partial vias extending only up to the remaining substrate 110.

FIGS. 10A-10F illustrate a semiconductor protection device comprising a vertical device and a lateral trigger element in various stages of fabrication in accordance with embodiments of invention.

Figure 10A:
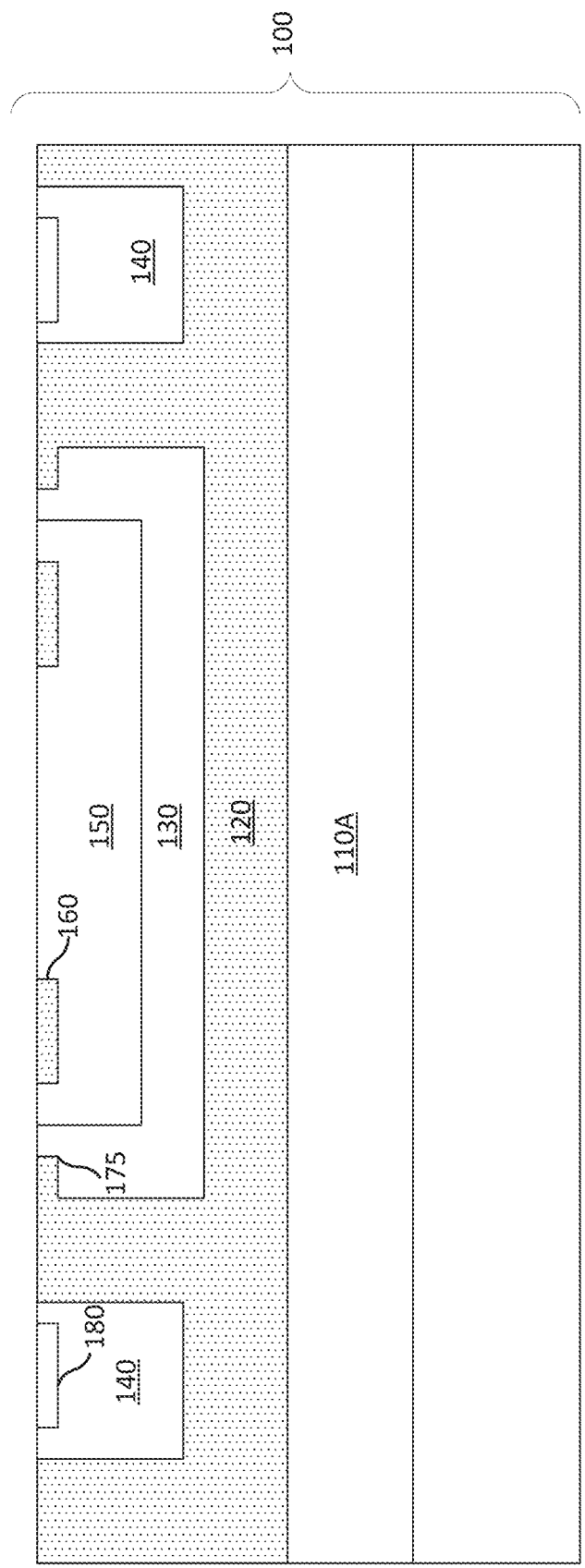
FIGS. 10A-10F illustrate a semiconductor protection device comprising a vertical device and a lateral trigger element in various stages of fabrication in accordance with embodiments of invention.

As illustrated in FIG. 10A, in one embodiment, the semiconductor doped regions are formed in the substrate 100. The substrate 100 may include one or more epitaxial layers in various embodiments. The substrate 100 may comprise a silicon wafer, germanium wafer, gallium nitride wafer including a gallium nitride layer on a substrate, a silicon carbide wafer include a silicon carbide layer on a substrate, and other semiconductor substrates in various embodiments.

The substrate 100 may include an epitaxial layer 110A formed using epitaxial process during wafer preparation. As previously described, in one embodiment, the first doped region 120 is formed to be a p-type doping. The first doped region 120 may be a buried layered formed using deep implantation. Alternatively, the first doped region 120 may be epitaxially grown over the epitaxial layer 110A.

The second doped region 130 may be formed within the first doped region 120 using an implantation process after opening a masking layer. The third doped region 150 and the fourth doped region 140 may be formed together using an implantation step in one embodiment. The fourth doped region 140 140 and third doped region 150 may be formed by epitaxial growth of intrinsic or lightly doped (n⁻/p⁻) semiconductor in another embodiment. The sixth doped region 180 is formed within the fourth doped region 140 to have an n-type doping. The fifth doped region 160 and the seventh doped region 175 have a p-type doping and may be implanted at the same time.

Figure 10B:
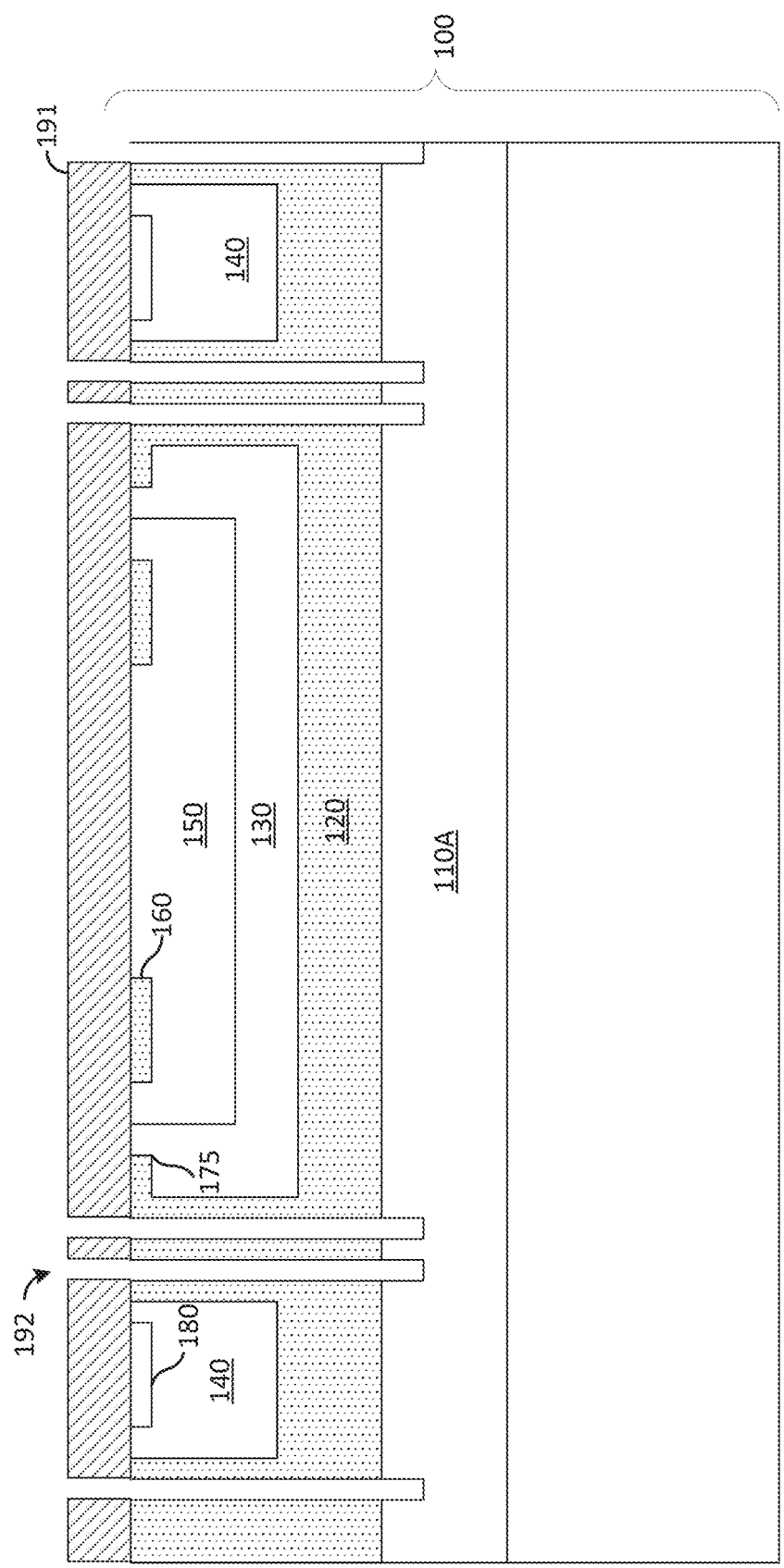

Referring to FIG. 10B, a masking layer 191 is formed over the substrate 100 and patterned. The masking layer 191 may be structured using conventional lithographic techniques in one or more embodiments.

Using the structured masking layer 191 as an etch mask, the substrate 100 may be etched to form openings 192. For example, a deep reactive ion etching process may be used to form the openings 192 in one embodiment. In some embodiments, a Bosch etch may be used, where the process switches between etching and deposition. The deposition step protects the sidewalls and prevents lateral etching of the sidewalls during the subsequent etch steps.

Figure 10C:
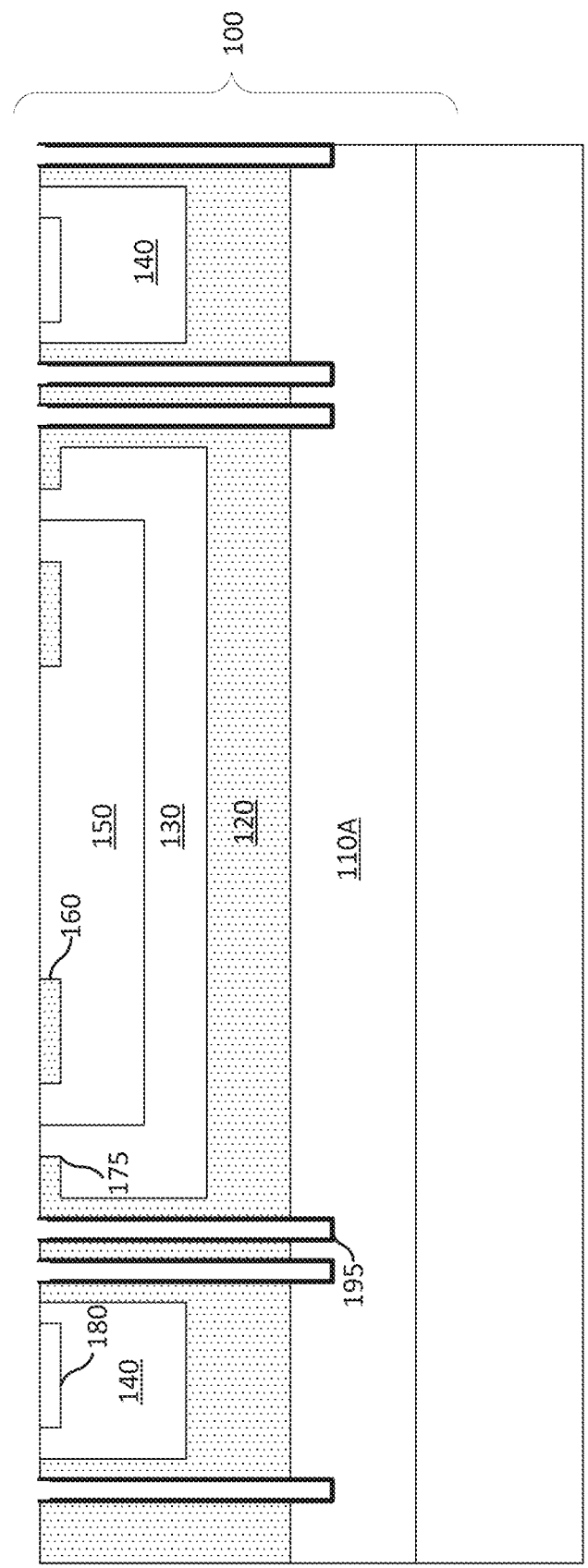

As next illustrated in FIG. 10C, the openings 192 are filled with a conductive material. In one embodiment, the conductive material comprises a metallic material such as a metal alloy, a pure metal, a metallic compound, and/or an intermetallic. Examples include aluminum, copper, titanium, tungsten, tantalum, hafnium, and others.

In one or more examples, a metallic liner 195 may be deposited followed by the deposition of a fill material. In some embodiments, the metallic liner 195 may be a metal nitride such as titanium nitride, tungsten nitride, hafnium nitride, and/or tantalum nitride. In other embodiments, carbides may also be used.

In various embodiments, the metallic liner 195 may be deposited using an atomic layer deposition process, chemical vapor deposition process, a physical vapor deposition process, sputtering, evaporation, and other processes.

A fill material 196 (FIG. 10D) may be optionally deposited within the openings 192. The fill material may be a conductive material or may be an insulating material in various embodiments. For example, in one embodiment, a spin on glass may be deposited within the openings 192. Alternatively, in other embodiments, the fill material may be a conductive material such as tungsten, copper, aluminum, and others.

Figure 10D:
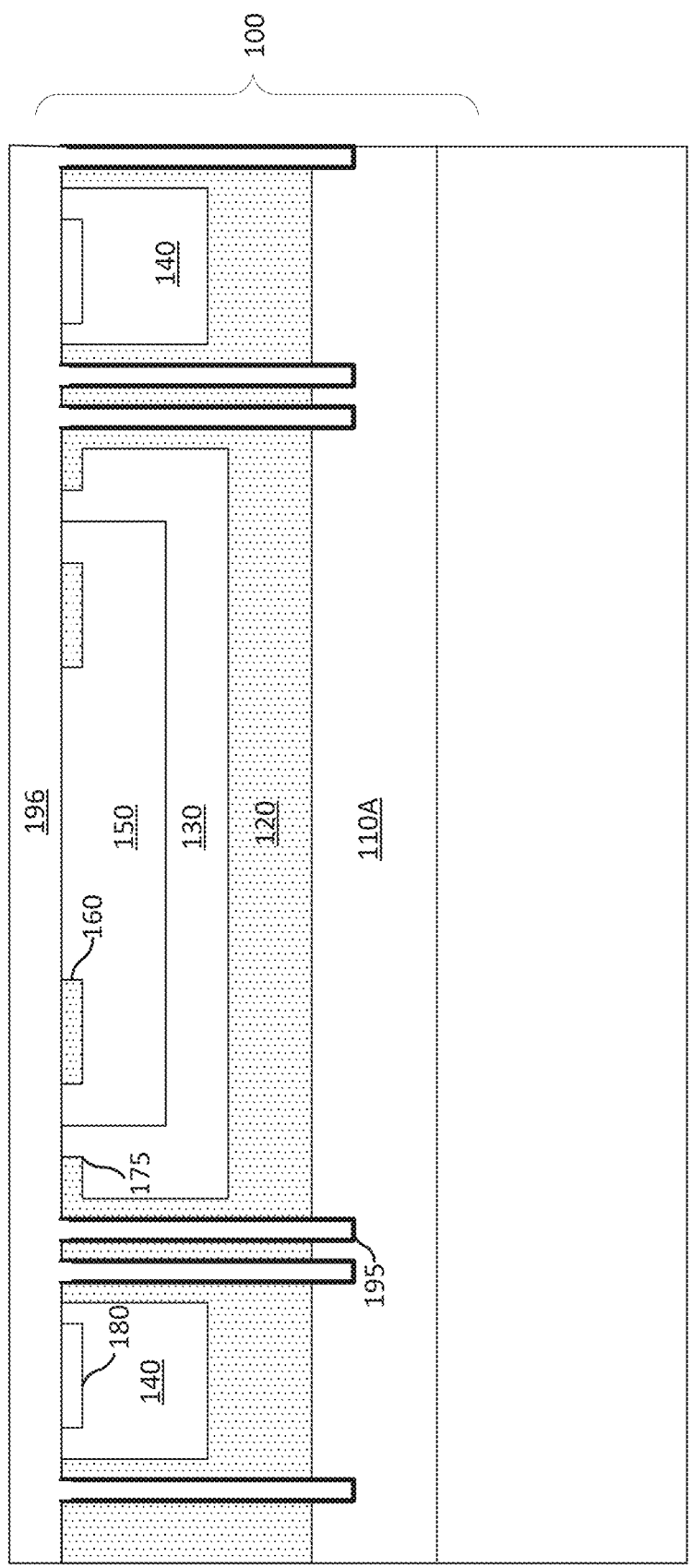
Figure 10E:
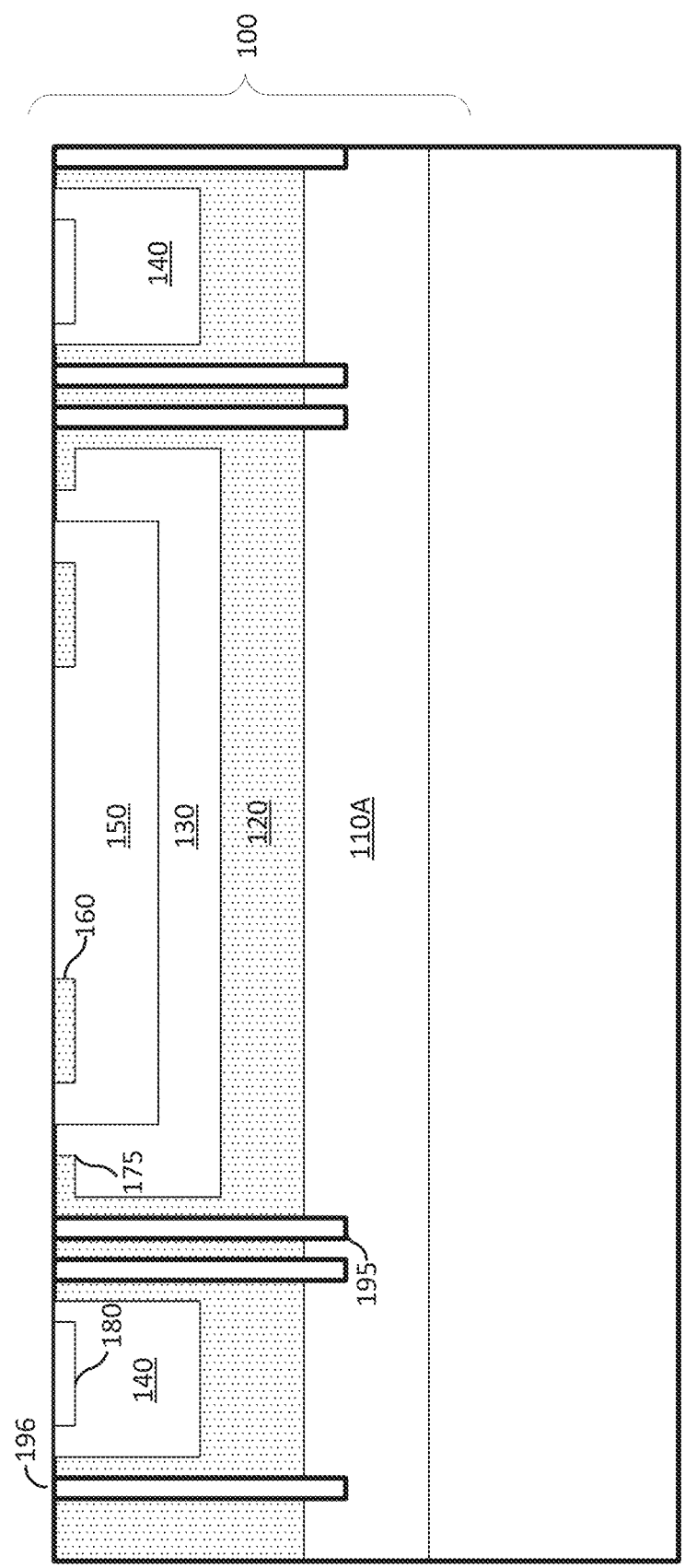

The fill material 196 is removed from over the substrate 100, for example, using a chemical mechanical polishing process (FIG. 10E). An insulating layer 112 is deposited over the substrate 100. In one or more embodiments, the insulating layer 112 may include one or more insulating layers such as silicon dioxide, silicon nitride, and others. A plurality of interconnects 114 are formed within the insulating layer 112 so as to contact the doped regions of the substrate 100 that form terminals of the devices. For example, the fifth doped region 160 is coupled to the interconnects 114. A metal interconnect layer 116 is formed over the insulating layer 112.

In various embodiments, one or more metallization layers may be formed over the insulating layer 112. In one example, the metal interconnect layer 116 comprises a aluminum pad. In further examples, a passivation layer and one or more contact pads may be formed over the metal interconnect layer 116 as needed in one or more embodiments.

Subsequent processing may follow conventional processes as known to a person having ordinary skill in the art. For example, the substrate 100 may be thinned from the back side and a back side metallization layer may be deposited on the back side of the remaining substrate.

Figure 11:
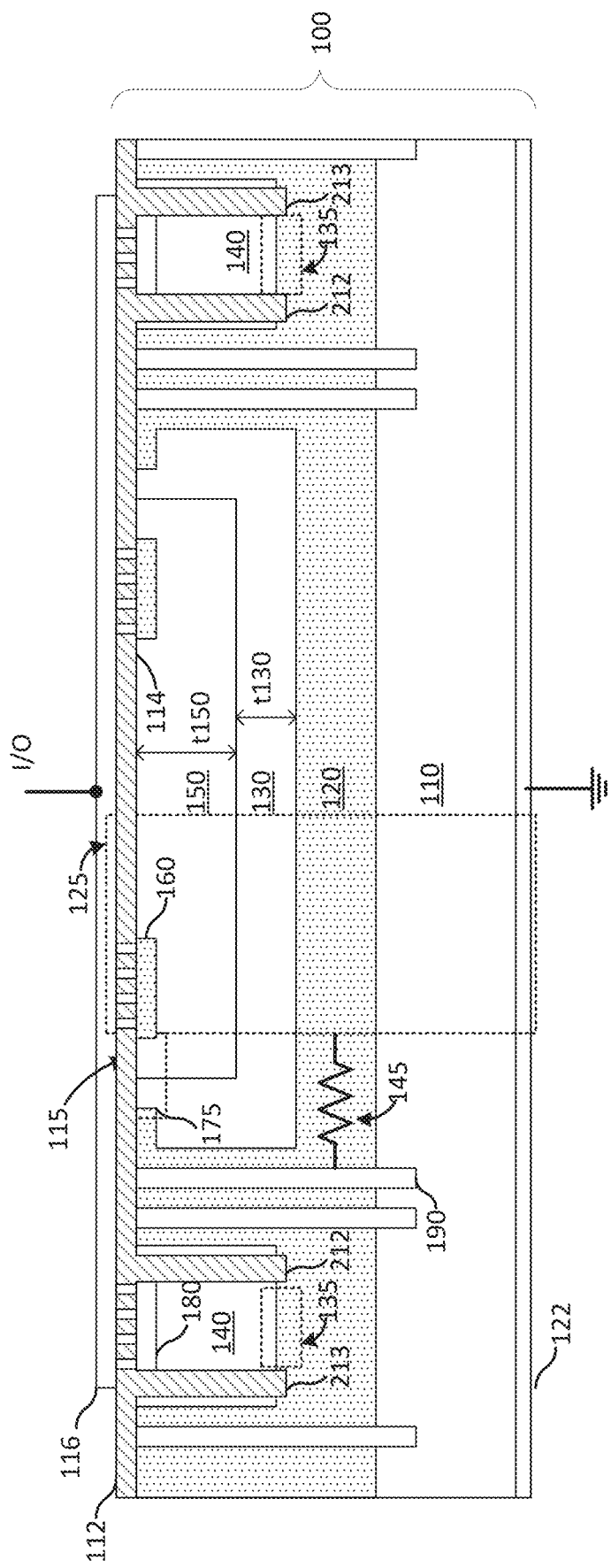
FIG. 11 illustrates a cross-sectional view of an alternative embodiment of an ESD protection device comprising a vertical device and a lateral trigger element in which the lateral trigger element is coupled to the back side metallization by interconnects and further including isolation structures.

FIG. 11 illustrates a cross-sectional view of an alternative embodiment of an ESD protection device comprising a vertical device and a lateral trigger element in which the lateral trigger element is coupled to the back side metallization by interconnects and further including isolation structures.

Referring to FIG. 11, an inner isolation 212 and an outer isolation 213 may be disposed in the substrate 100 surrounding the blocking diode 135. In one embodiment, the inner isolation 212 and the outer isolation 213 may be formed as a ring surrounding the sixth doped region 180 and disposed in the fourth doped region 140.

Figure 12A:
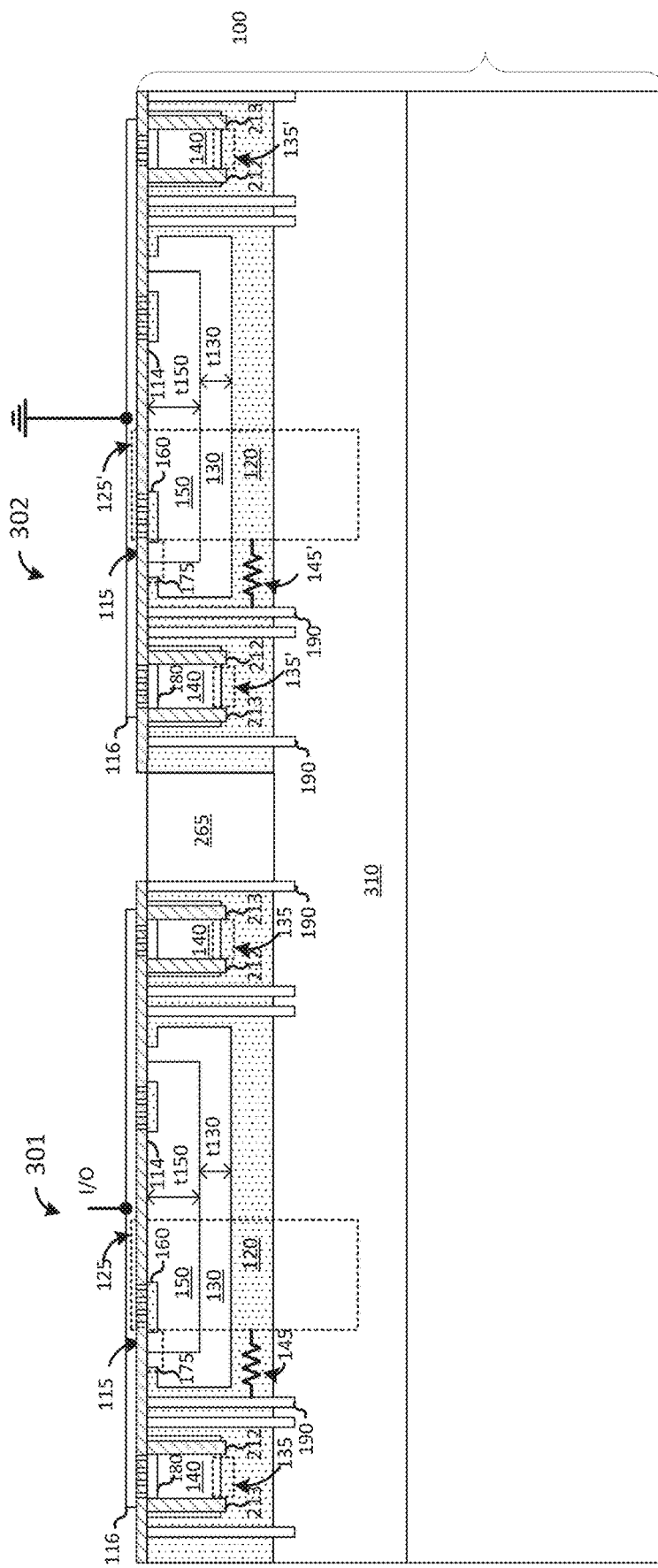
FIG. 12A illustrates a cross-sectional view of an alternative embodiment of a bidirectional transient voltage suppressor device comprising two devices: a first device comprising a vertical device and a lateral trigger element and a second device comprising a vertical device and lateral trigger element in which the first device and the second device are oppositely oriented, and the substrate is coupled to the front side through vias
Figure 12B:
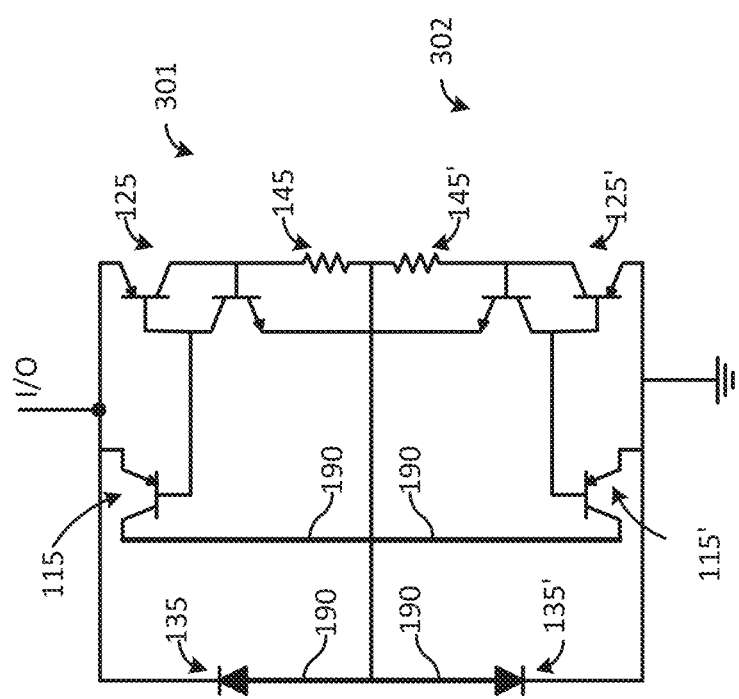
FIG. 12B illustrates the corresponding circuit of the bidirectional transient voltage suppressor device.

FIG. 12A illustrates a cross-sectional view of an alternative embodiment of a bidirectional transient voltage suppressor device comprising two devices. FIG. 12B illustrates the corresponding circuit diagram.

A first device 301 comprises a vertical device 125 and a lateral trigger element 115 and a second device 302 comprises a vertical device 125' and a lateral trigger element 115'. The vertical device 125 of the first device 301 and the vertical device 125' of the second device 302 share the substrate region 310, which is similarly doped as the remaining substrate 110 in prior embodiments. However, as the final chip has all contacts on the front side, the substrate region 310 is coupled to the front side through interconnects 190. As an illustration, the optional isolating region 265 may be an oxide isolation region. However, the isolating region 265 is not necessary and may be removed if enough process tolerance between the adjacent devices is achievable.

Accordingly, the embodiment of FIG. 12A-12B is a bidirectional device.

Figure 13:
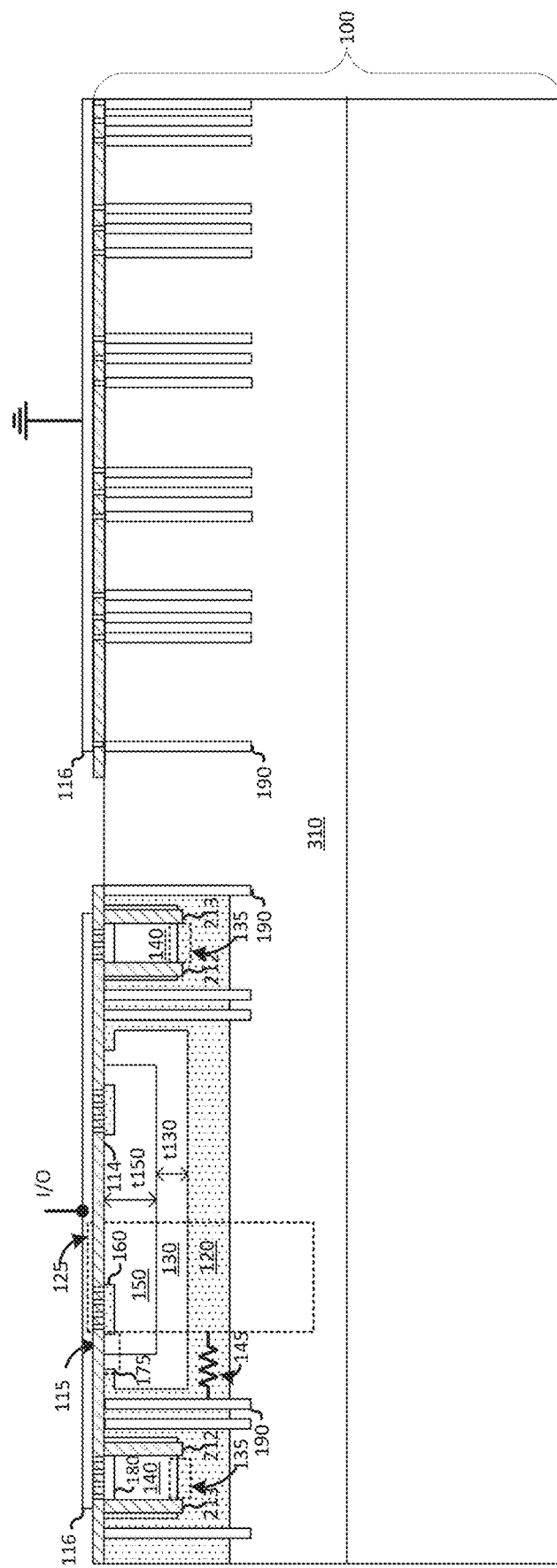
FIG. 13 illustrates a cross-sectional view of an alternative embodiment of a unidirectional transient voltage suppressor device comprising a vertical device and a lateral trigger element, and the substrate is coupled to the front side through interconnects.

FIG. 13 illustrates a cross-sectional view of an alternative embodiment of a unidirectional transient voltage suppressor device comprising a vertical device 125 and a lateral trigger element 115, and the substrate region 310 is coupled to the front side through interconnects 190.

Unlike the embodiment of FIG. 12A, this embodiment is unidirectional and similar in operation to FIG. 4 (or FIG. 11) described earlier. However, in this embodiment, interconnects 190 connect to pads on the front side of the substrate 100 so that both contacts of the ESD device are on the same side of the substrate 100. The interconnects 190 provide a low ohmic contact to the substrate region 310.

Embodiments of the present invention described in FIGS. 1-13 may be formed using a well design or in a bottom-up design. The following figures will be used to further describe embodiments using a bottom-up process. Accordingly, further details of the bottom-up process will be described followed by corresponding structural embodiments.

FIGS. 14A-14L illustrate a semiconductor protection device comprising a vertical device and a lateral trigger element in various stages of fabrication in accordance with embodiments of invention.

In contrast to FIG. 10, which illustrated a generic embodiment comprising both a well design and a epitaxial design, the embodiment of FIG. 14 specifically illustrates a epitaxial process using a bottom-up process.

Figure 14A:
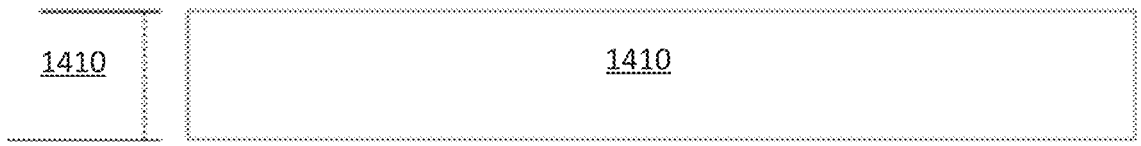
FIGS. 14A-14L illustrate a semiconductor protection device comprising a vertical device and a lateral trigger element in various stages of fabrication in accordance with embodiments of invention.

In this embodiment, as illustrated in FIG. 14A, the semiconductor wafer 1410 is a semiconductor substrate having a first doping type (e.g., an n-type substrate) and may comprise various semiconductor materials as described above in prior embodiments.

Figure 14B:
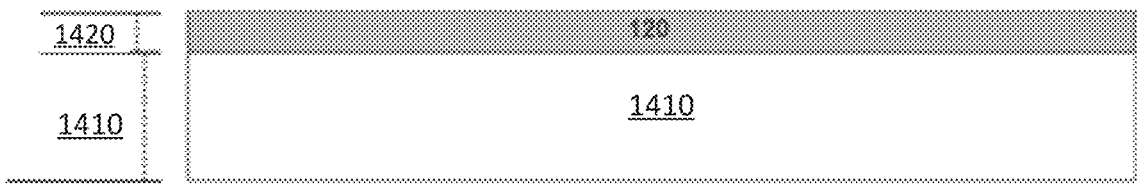

Referring to FIG. 14B, a first epitaxial process is used to deposit epitaxially a first epitaxial layer 1420 comprising a layer of a second doping type (e.g., a p-type layer). In various embodiments, the first epitaxial layer 1420 may comprise a thickness of about 1 µm to 5 µm and about 2 µm as an illustration. The first epitaxial layer 1420 may be similar to the layer (first doped region 120 described above in prior embodiments), and as illustrated in FIG. 14B, at least a portion of the first epitaxial layer 1420 contains the first doped region 120. In various embodiments, the first epitaxial process is used to grow a homo-epitaxial layer, however, in some embodiments, a hetero-epitaxial layer may also be grown.

Figure 14C:
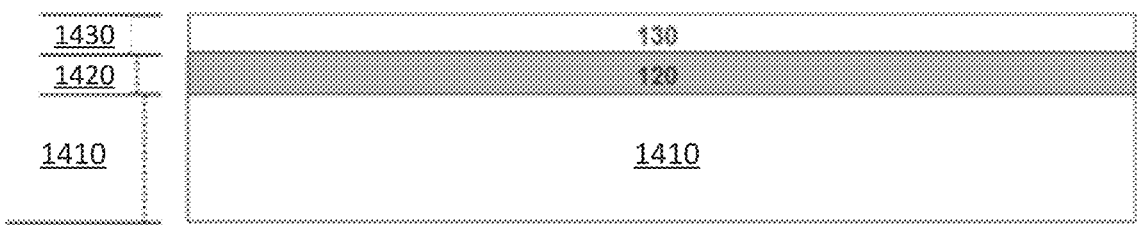

FIG. 14C illustrates the device after forming a second epitaxial layer 1430 using a second epitaxial process. The first epitaxial process and the second epitaxial process may be performed continuously by changing the flow of dopant gases during the growth process. The second epitaxial layer 1430 includes a region for forming the second doped region 130 described in various embodiments above. The second epitaxial layer 1430 may have the same doping type as the semiconductor wafer 1410 in various embodiments.

Figure 14D:
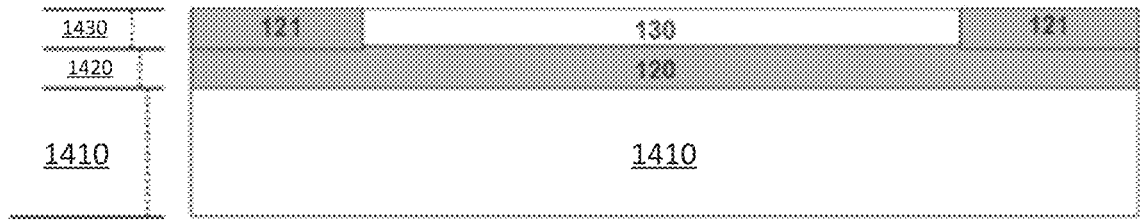

Referring to FIG. 14D, portions of the second epitaxial layer 1430 not forming the vertical thyristor may be counter-doped. For example, after forming an implant mask, the second doping type dopants may be implanted into the second epitaxial layer 1430. After an annealing process, a first counter-doped region 121 is formed around the second doped region 130.

Figure 14E:
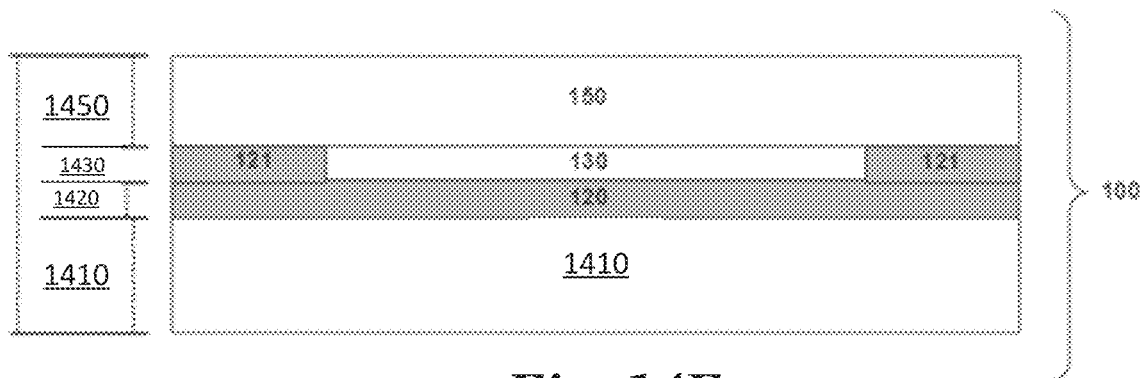

As next illustrated in FIG. 14E, a third epitaxial layer 1450 may be grown over the second epitaxial layer 1430 using a third epitaxial process. Similar to the first and the second epitaxial processes, in one or more embodiments, the third epitaxial process may be a blanket process, i.e., the epitaxial layer is grown globally over the entire surface of the wafer. The third epitaxial layer 1450 may be a low doped region and may be even an intrinsic region, for example, as described above with respect to a third doped region 150, which is contained within the third epitaxial layer 1450.

Figure 14F:
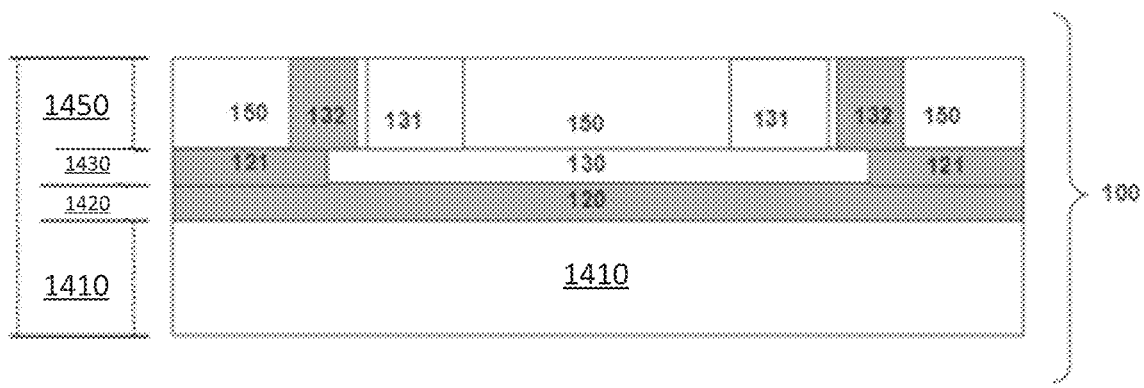

Referring to FIG. 14F, the third epitaxial layer 1450 may be doped as well as counter-doped using ion implantation and annealing after which an implanted region 131 having the first doping type and a second counter-doped region 132 having the second doping type is formed.

Figure 14G:
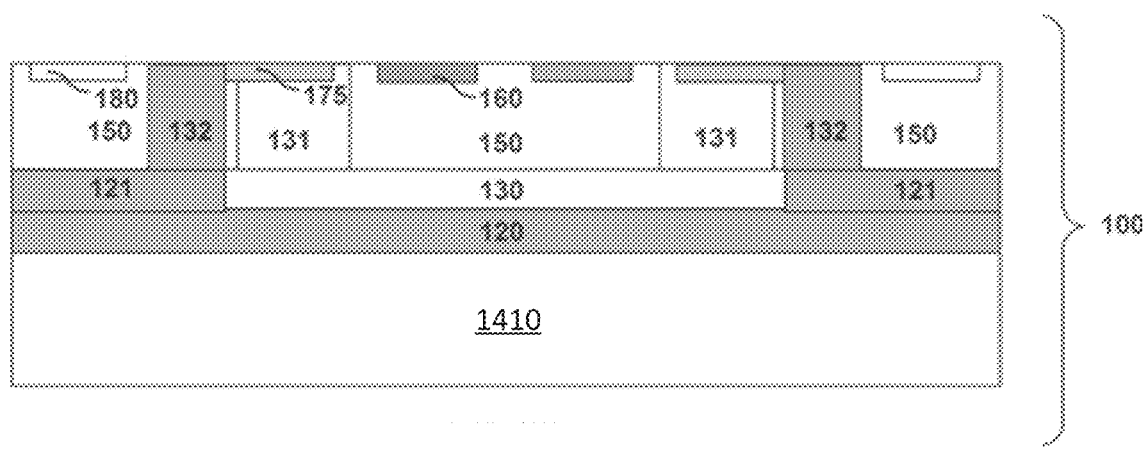

As previously described using FIG. 10A, as next illustrated in FIG. 14G, a sixth doped region 180 is formed having the first doping type (e.g., n-type doping). A fifth doped region 160 and a seventh doped region 175 having the second doping type (e.g., p-type doping) are formed.

Figure 14H:
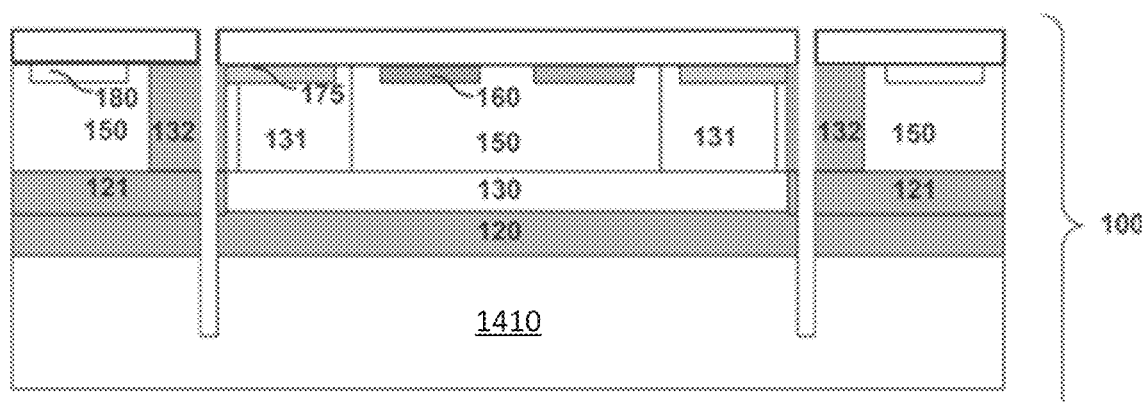

Subsequent FIG. 14H corresponds to FIG. 10B of the previously described fabrication process. Accordingly, as previously described in FIG. 10B, openings 192 are formed using the structured masking layer 191.

Figure 14I:
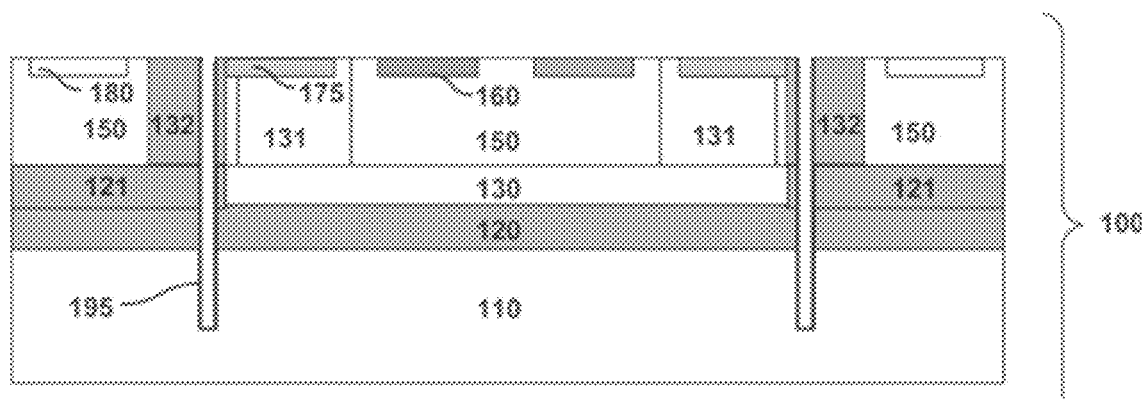
Figure 14J:
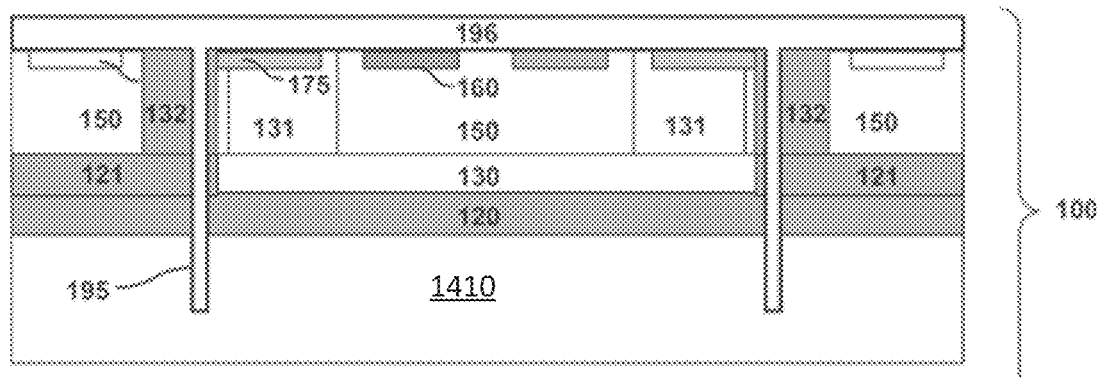

FIG. 14I corresponds to FIG. 10C and illustrates filling of the openings 192 with metallic liner 195 and FIG. 14J corresponds to FIG. 10D and shows the subsequent filling with the fill material 196.

Figure 14K:
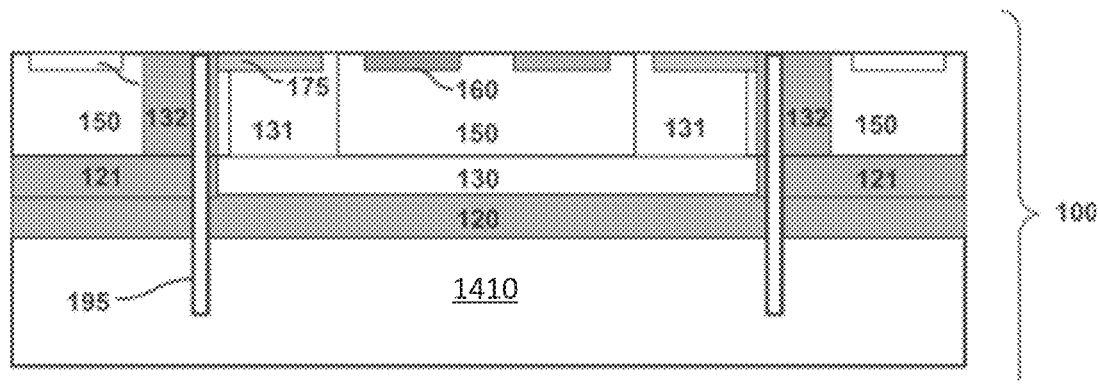

FIG. 14K, which corresponds to FIG. 10E, illustrates the device after a planarization process to remove the excess fill material 196 from over the wafer 1410.

Figure 10F:
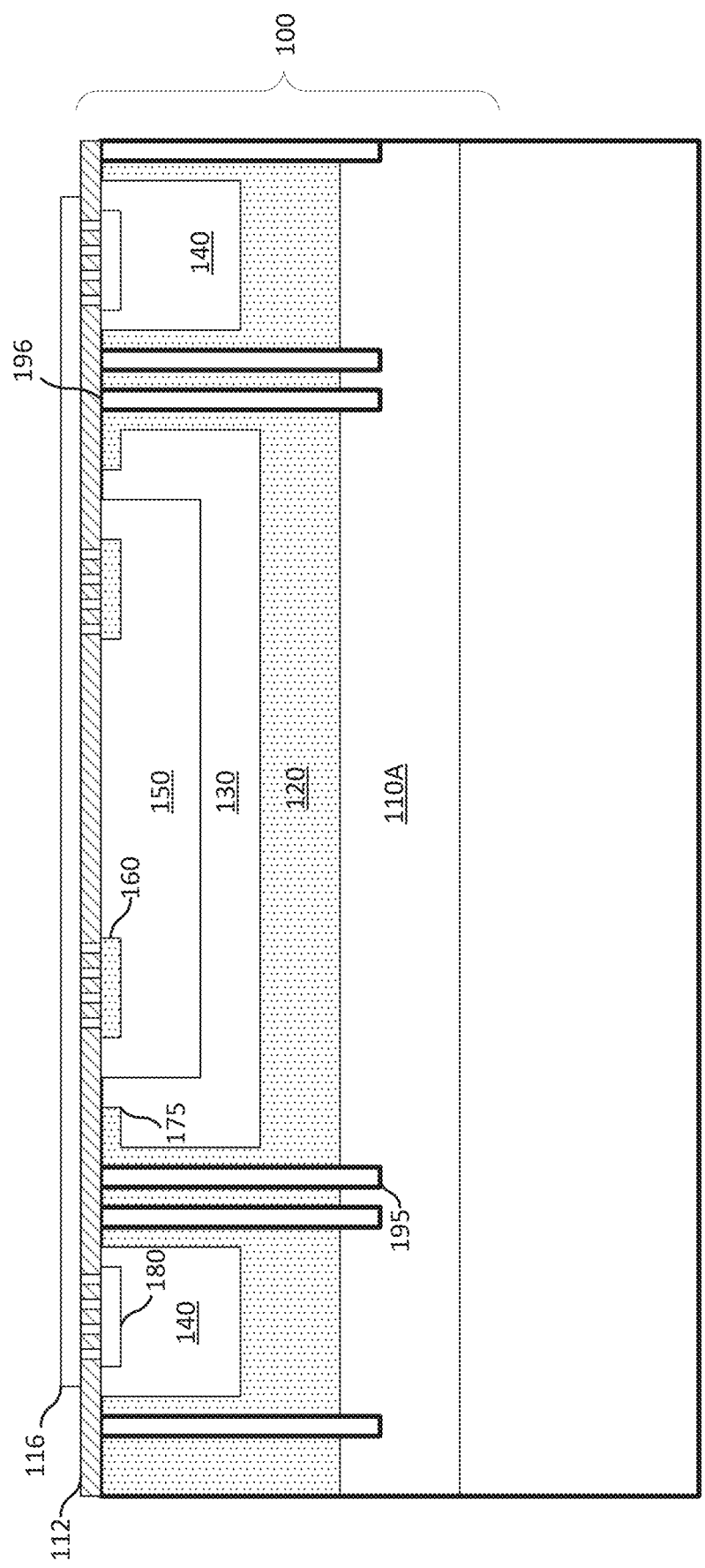
Figure 14L:
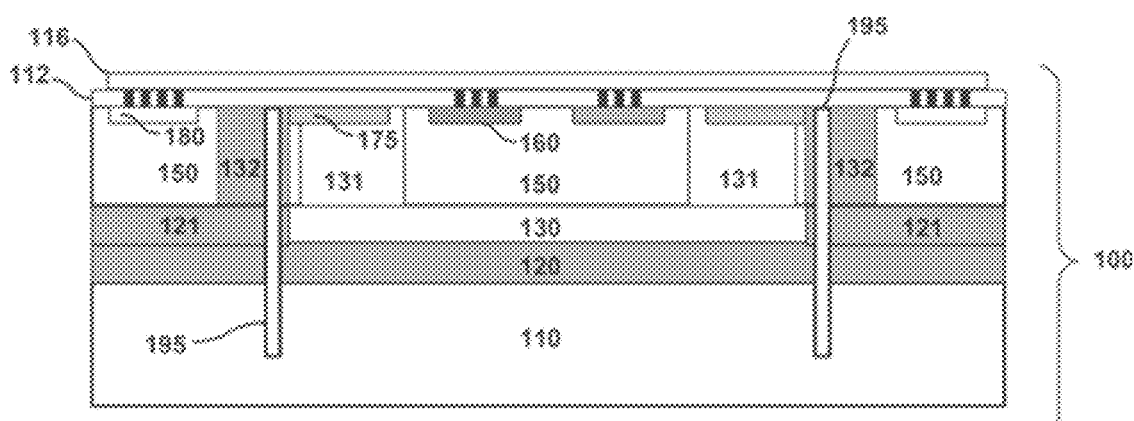

FIG. 14L, which corresponds to FIG. 10F, illustrates the device after forming one or more metallization layers. For example, a plurality of interconnects 14 is formed within the insulating layer 112 so as to contact the doped regions of the substrate 100 that form terminals of the devices. A metal interconnect layer 116 is formed over the insulating layer 112. After front side processing, the back side of the wafer 1410 is thinned from the back side so as to form a thinner remaining substrate 110.

FIGS. 15-19 illustrate structural embodiments using the process flow described in FIG. 14. FIGS. 15-20 are examples of specific embodiments described previously.

Figure 15:
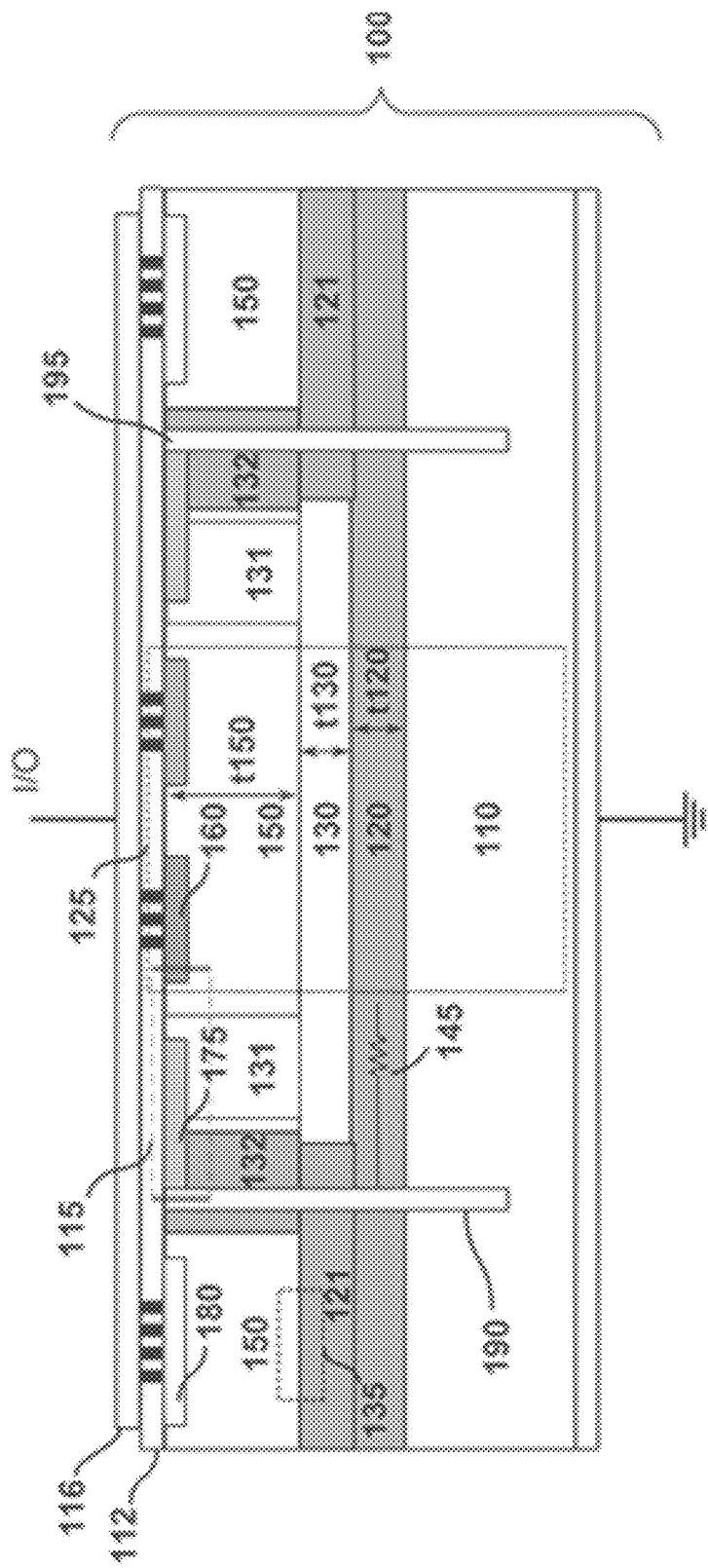
FIG. 15 illustrates a cross-sectional view of an alternative embodiment of an ESD protection device comprising a vertical device and a lateral trigger element.

FIG. 15 illustrates a cross-sectional view of an alternative embodiment of an ESD protection device comprising a vertical device and a lateral trigger element. FIG. 15 is a specific embodiment of the generic embodiment illustrated in FIG. 4A and therefore the corresponding top schematic of ESD protection device may be the same as illustrated in FIGS. 4B and 4D. The corresponding circuit schematic is illustrated and described using FIG. 4C.

Referring to FIG. 15, the substrate 100 comprises a plurality of epitaxial regions grown over each other in a bottom up process as will be clear from the process flow described subsequently. Accordingly, in this embodiment, the first doped region 120, second doped region 130, the third doped region 150 are each formed as epitaxial layers. Accordingly, embodiments of the present invention, include a first counter-doped region 121 formed by counter-doping a portion of the epitaxial layer comprising the second doped region 130. In this embodiment, the plurality of conductive interconnects 190 is prevented from contacting the third doped region 150 by a counter-doped region. Accordingly, the plurality of conductive interconnects 190 is formed through a second counter-doped region 132, which separates and thereby isolates each of the plurality of conductive interconnects 190 from the implanted region 131 and the third doped region 150, which have the same doping type opposite to the second doped region 130.

Figure 16:
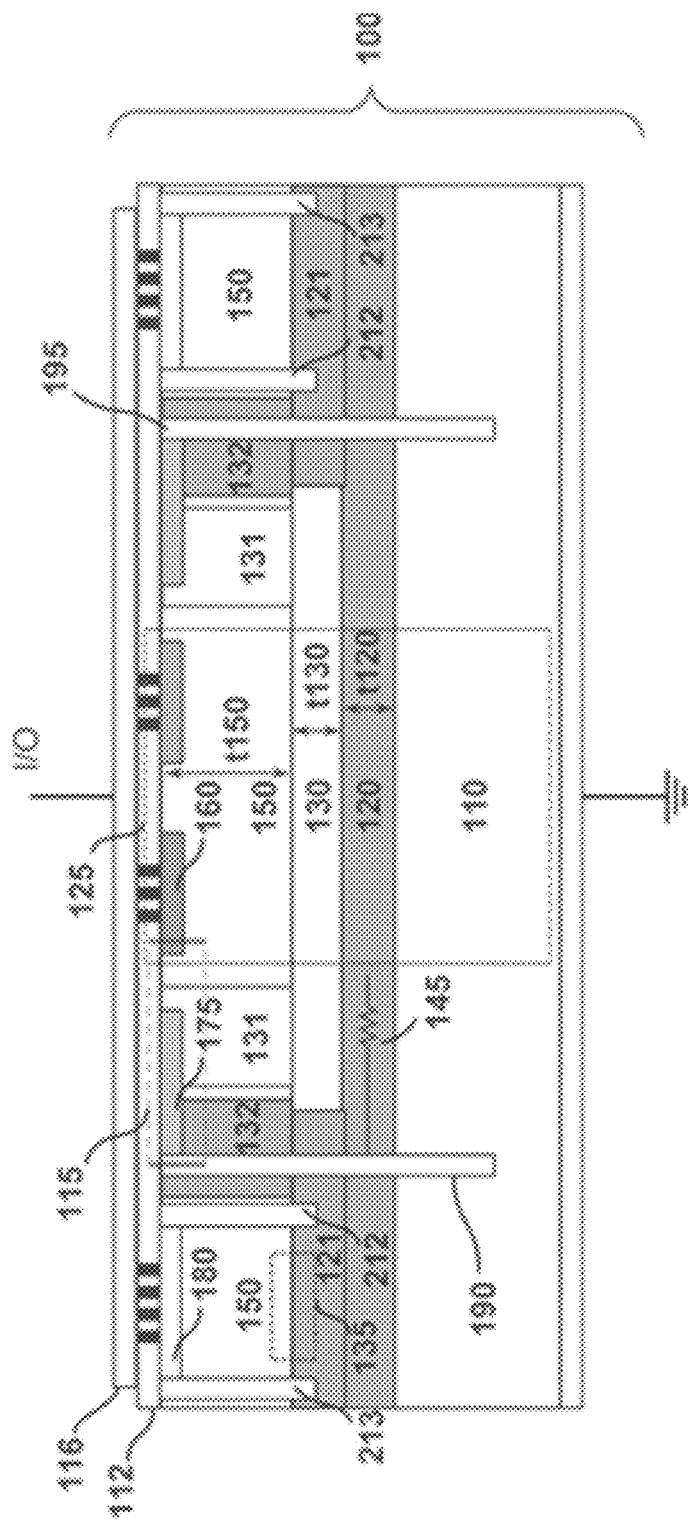
FIG. 16 illustrates an alternative embodiment comprising an isolation trench to isolate the blocking diode from the other components.

FIG. 16 illustrates an alternative embodiment comprising an isolation trench to isolate the blocking diode 135 from the other components. As described in FIG. 11, inner isolation 212 and an outer isolation 213 may be formed in the substrate 100 (over the remaining substrate 110) surrounding the blocking diode 135, for example, in a concentric design. Additionally, the isolation trenches reduce the larger capacitance of the lateral diodes.

Figure 17:
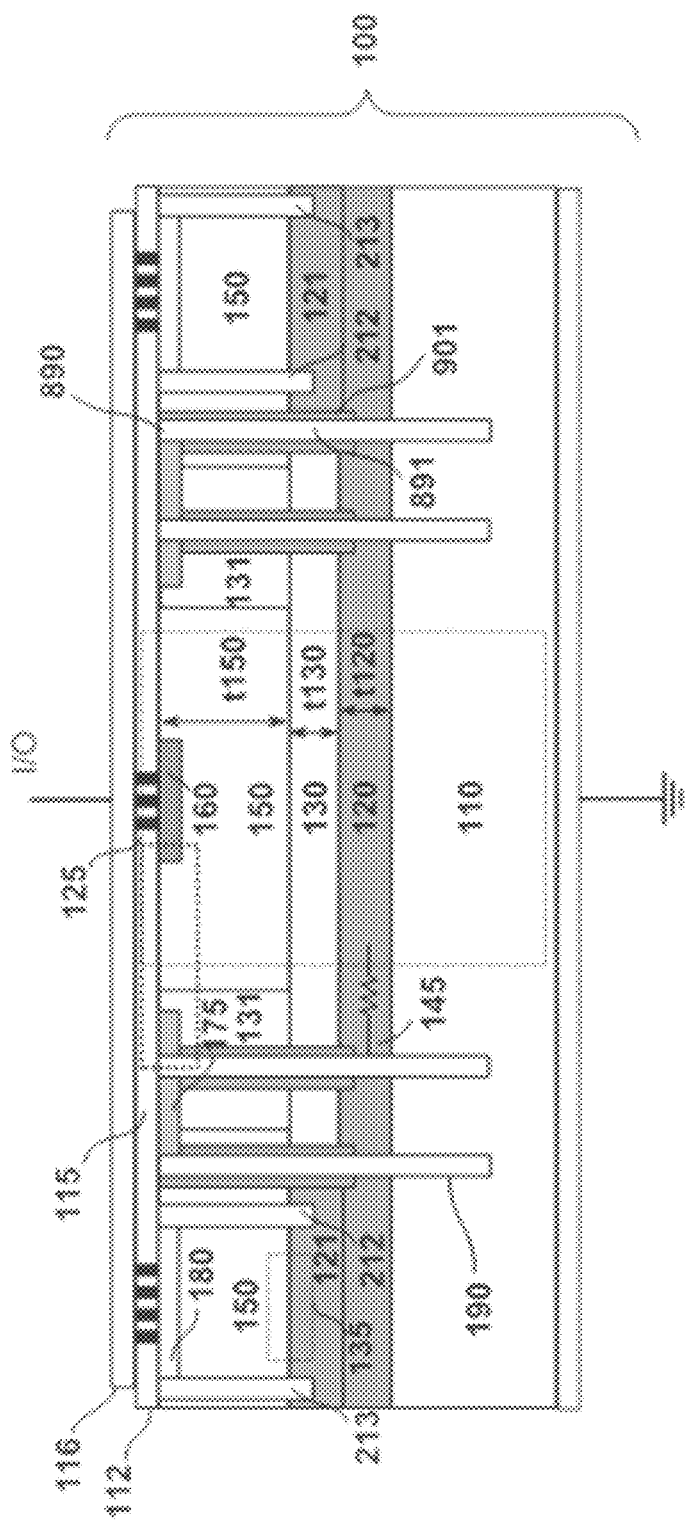
FIG. 17 illustrates a counter-doped region surrounding each of the plurality of conductive interconnects in accordance with an embodiment of the present invention.

FIG. 17, which corresponds to FIG. 8A, illustrates a counter-doped region surrounding each of the plurality of conductive interconnects 190 in accordance with an embodiment of the present invention. Similar to FIG. 8A that uses an insulating region, the counter-doped surrounding region 901 prevents the shorting of the metallic material 891 with the implanted region 131 and the third doped region 150. Advantageously, this device also results in significant area saving due to smaller lateral space needed, i.e., the second counter-doped region 132 may be shrunk laterally or may be even eliminated in some embodiments.

Figure 18:
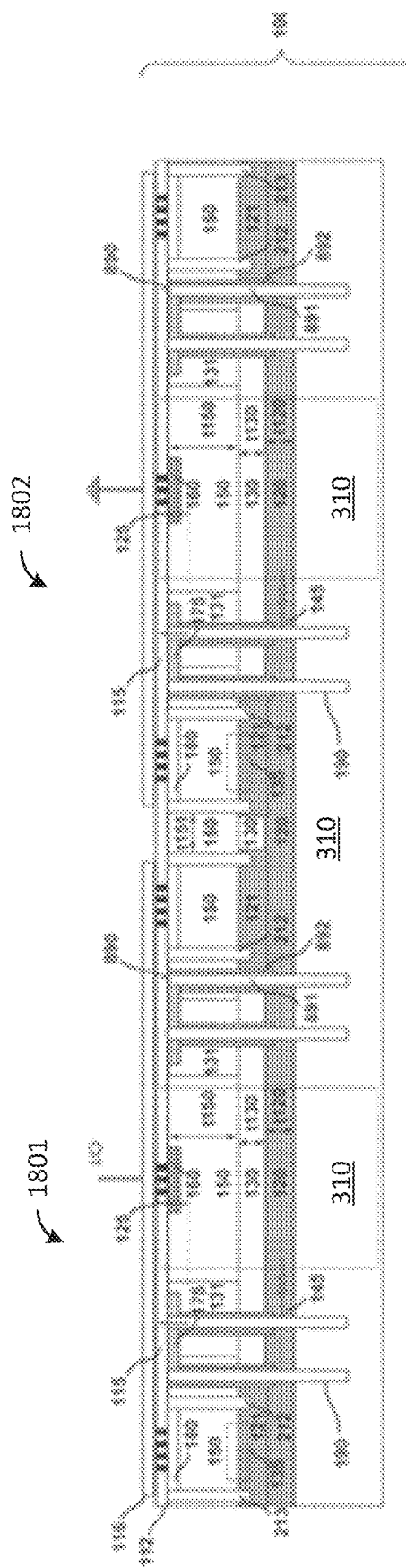
FIG. 18 is a cross-sectional view of an alternative embodiment of a bidirectional transient voltage suppressor device comprising two devices.

FIG. 18, which corresponds to FIG. 12A, is a cross-sectional view of an alternative embodiment of a bidirectional transient voltage suppressor device comprising two devices. FIG. 12B illustrates the corresponding circuit diagram.

Similar to FIG. 12A, a left side device 1801 comprises a vertical device and a lateral trigger element and a right side device 1802 comprises a vertical device and lateral trigger element in which the left side device 1801 and right side device 1802 are oppositely oriented, and the substrate is coupled to the front side through vias.

Each of the individual devices (left side device 1801 and right side device 1802) may be similar to the cross-section shown in FIG. 17 (but without the back side contact similar to FIG. 12A). The distance t151 between the adjacent left side device 1801 and right side device 1802 may be controlled to maintain a suitable isolation. Further, a portion of the second doped region 130 is used to better isolate the first counter-doped region 121 of the left side device 1801 from the first counter-doped region 121 of the right side device 1802.

Figure 19:
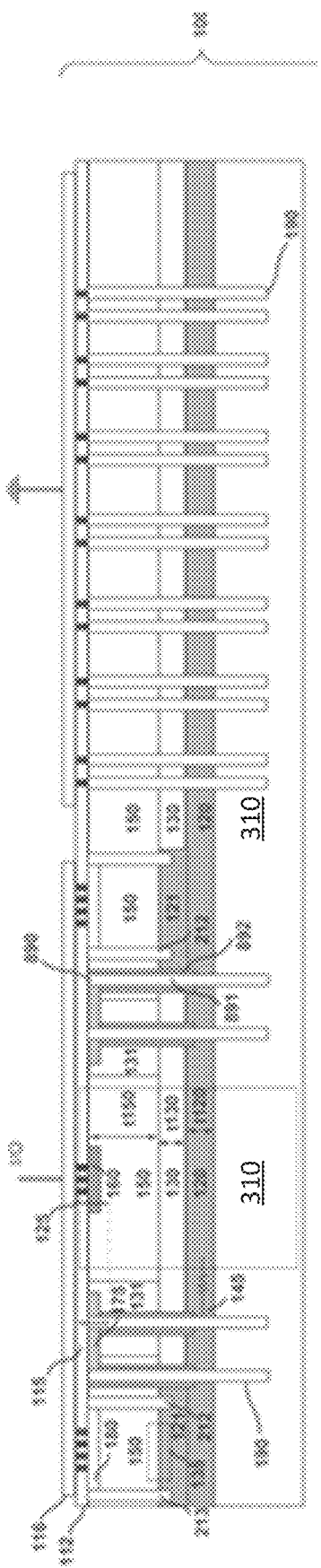
FIG. 19 illustrates a cross-sectional view of an alternative embodiment of a unidirectional transient voltage suppressor device comprising a vertical device and a lateral trigger element, and the substrate is coupled to the front side through interconnects.

FIG. 19, which corresponds to FIG. 13, illustrates a cross-sectional view of an alternative embodiment of a unidirectional transient voltage suppressor device comprising a vertical device and a lateral trigger element, and the substrate is coupled to the front side through interconnects.

When using the bottom up process described in FIG. 14, all regions of the substrate 100 include a blanket epitaxial layers. As a consequence, the plurality of conductive interconnects 190 from the substrate region 310 to the front side forms a short through the p/n junctions (substrate region 310 and first doped region 120 as well as first doped region 120 and the second doped region 130).

Accordingly, in this embodiment, each of the plurality of conductive interconnects 190 includes p/n shorts unlike FIG. 13 where the substrate to ground interconnects did not form a p/n short. In this case, each of the I/O to substrate interconnect as well as each of the substrate to ground interconnect form at least one p/n short.

Figure 20A:
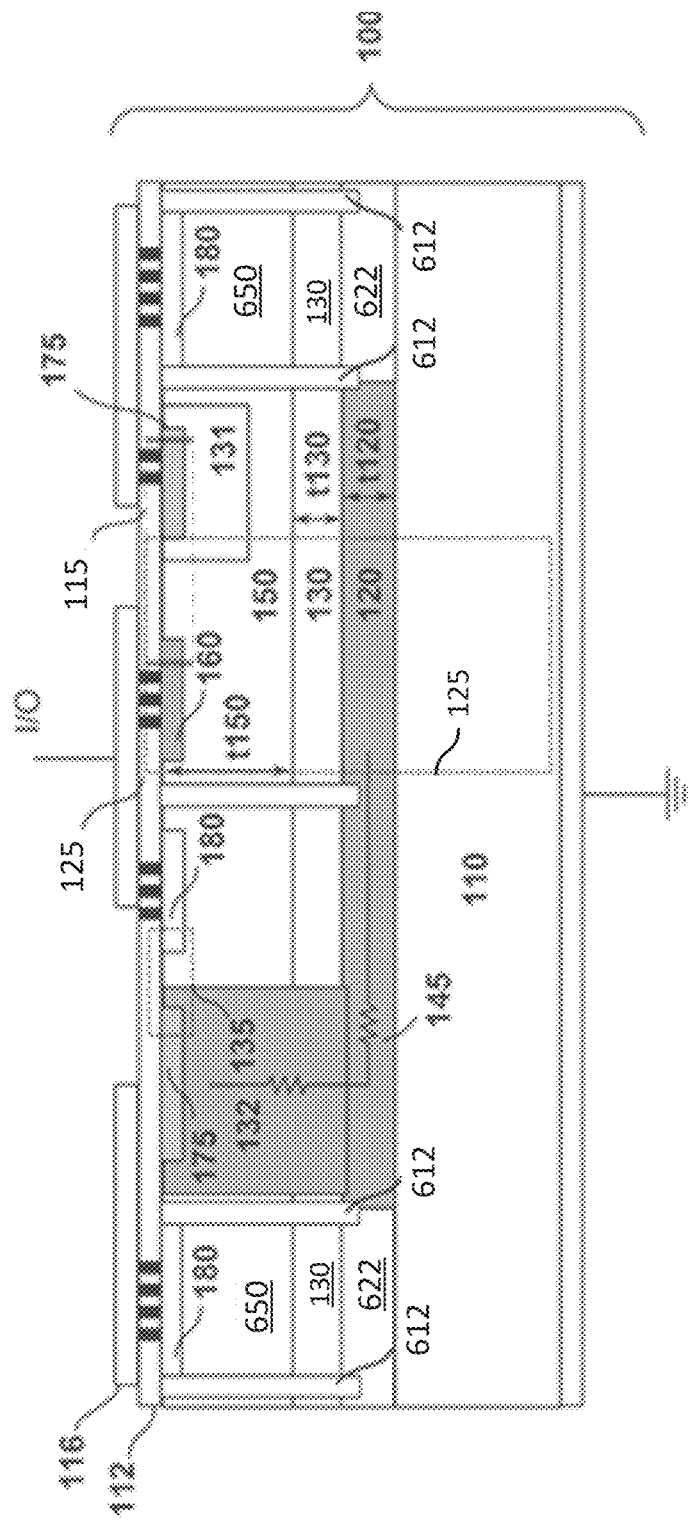
FIG. 20A illustrates a cross-sectional schematic of a vertical device having no metal trench interconnects in accordance with embodiments of the present invention.

FIG. 20A illustrates a cross-sectional schematic of a device having no metal trench interconnects in accordance with embodiments of the present invention.

The protection device includes a lateral trigger element 115, a vertical device 125, and a blocking diode 135 as described in prior embodiments. The lateral trigger element 115 is formed as a bipolar transistor, e.g., a PNP transistor, is between the fifth doped region 160 and the seventh doped region 175. An additional well region 131 may be disposed under the seventh doped region 175. Accordingly, one terminal of the lateral trigger element 115 is coupled to ground and the other terminal is coupled to the I/O node. The blocking diode 135 is formed as a lateral diode in this embodiment.

Unlike prior embodiments, which describe a trench interconnect, in this embodiment, a sinker region is used to contact with the underlying remaining substrate 110. The sinker regions comprise a buried sinker region 622, which may be formed by implanting the epitaxial layer forming the first doped region 120 before growing the epitaxial layer forming the second doped region 130. The sinker regions further comprise implanted sinker region 650, which is a portion of the third doped region 150 separated by isolation trenches 612.

Figure 20B:
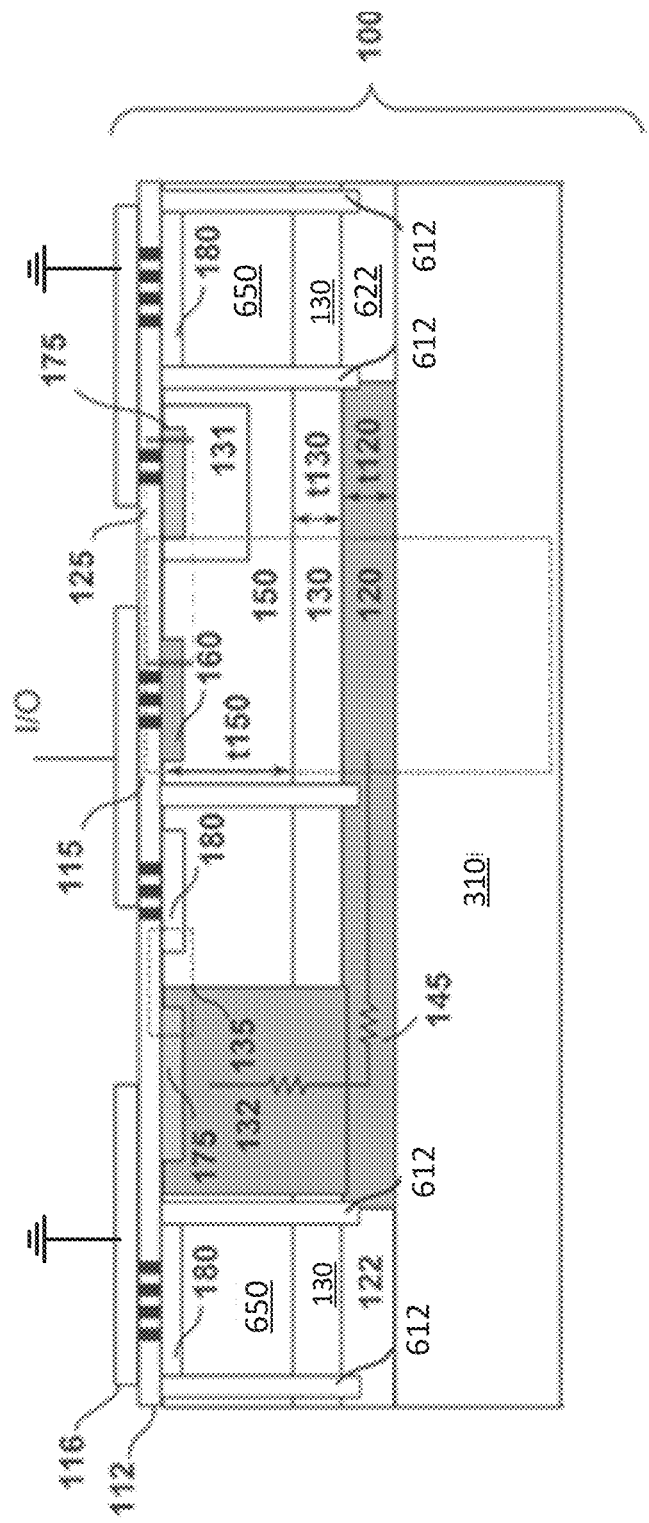
FIG. 20B illustrates a cross-sectional schematic of an alternative device having no metal trench interconnects and having all contact over the same surface in accordance with embodiments of the present invention.

FIG. 20B illustrates a cross-sectional schematic of an alternative device having no metal trench interconnects in accordance with embodiments of the present invention.

In addition to the features described in FIG. 20A, in this embodiment, the remaining substrate 110 is contacted to the front side of the substrate 100 through the sinker regions. Accordingly, in this embodiment, all contacts are formed over the same surface of the substrate 100.

The embodiments described in FIGS. 20A and 20B have the same circuit schematic as illustrated previously, for example, see FIG. 4C.

In a first embodiment, a semiconductor device includes a vertical protection device disposed in a substrate and a lateral trigger element disposed in the substrate. The lateral trigger element can be used for triggering the vertical protection device.

In some embodiments, the substrate includes a plurality of epitaxial layers disposed over a bulk semiconductor region.

In some embodiments, the vertical protection device includes a thyristor and the lateral trigger element includes a bipolar transistor.

In some embodiments, the vertical protection device includes an insulated gate bipolar transistor. The lateral trigger element includes a bipolar transistor.

In some embodiments, the lateral trigger element includes a pin diode.

In some embodiments, the lateral trigger element includes a bipolar transistor and MOS transistor or bipolar transistor and an insulated gate bipolar transistor.

In some embodiments, the lateral trigger element includes a bipolar transistor and a diode string.

In some embodiments, the semiconductor device further includes an opening disposed in the substrate and a metallic conduction layer electrically coupling the lateral trigger element with the vertical protection device.

In some embodiments, the opening includes a trench.

In some embodiments, the metallic conduction layer includes a metal nitride layer.

In some embodiments, the metallic conduction layer is disposed along sidewalls of the opening.

In some embodiments, the semiconductor device further includes a fill material disposed over the metallic conductive layer in the opening.

In some embodiments, the semiconductor device further includes an insulating sidewall spacer disposed in the opening. The metallic conductive layer is insulated from sidewalls of the opening by the sidewall spacer.

In some embodiments, the semiconductor device further includes a counter-doped region lining at least a portion of sidewalls of the opening.

In some embodiments, the opening is disposed in an implanted counter doped region disposed between a blocking diode and the lateral trigger device.

In some embodiments, the opening is a through opening and extends completely through the substrate.

In some embodiments, the semiconductor device further includes a second vertical protection device disposed in the substrate. A second lateral trigger element is disposed in the substrate. The second lateral trigger element is used for triggering the second vertical protection device. A second opening is disposed in the substrate and includes the metallic conduction layer electrically coupling the second lateral trigger element with the second vertical protection device.

In some embodiments, the vertical protection device is coupled to the second vertical protection device so as to form a two-terminal device that includes a first contact pad and a second contact pad. The first contact pad and the second contact pad are disposed over a same side of the substrate.

In some embodiments, the semiconductor device further includes a vertical diode disposed adjacent the vertical protection device.

In some embodiments, the semiconductor device further includes an isolation region disposed between the vertical diode and the vertical protection device.

In some embodiments, the semiconductor device further includes a first contact pad at a front side of the substrate. The first contact pad is coupled to a first terminal of the vertical protection device. The substrate is coupled to a second contact pad at the front side.

In some embodiments, a terminal region of the vertical protection device disposed in the substrate is coupled to the second contact pad at the front side through a doped sinker region and a metal line.

In some embodiments, a terminal region of the vertical protection device disposed in the substrate is coupled to the second contact pad at the front side through a metallic interconnect disposed in the substrate.

In some embodiments, an anode/cathode terminal is coupled to a node to be protected and the cathode/anode terminal is coupled to a reference potential node.

In some embodiments, an cathode/anode terminal is at a second major surface of the substrate and the cathode/anode terminal is at the first major surface of the substrate.

In another embodiment, a semiconductor device includes a protection device disposed in a substrate. The protection device includes an anode/cathode terminal at a first major surface of the substrate. A trigger input terminal is disposed in the substrate. The protection device also includes a cathode/anode terminal. A trigger element is disposed in the substrate. The trigger element includes a first terminal region coupled to the anode/cathode terminal of the protection device and a second terminal region laterally spaced from the first terminal region and coupled to the trigger input terminal.

In some embodiments, the anode/cathode terminal is coupled to a node to be protected and the cathode/anode terminal is coupled to a reference potential node.

In some embodiments, the cathode/anode terminal is at a second major surface of the substrate.

In some embodiments, the cathode/anode terminal is at the first major surface of the substrate.

In some embodiments, the semiconductor device further includes a doped sinker region disposed in the substrate. The second terminal region is coupled to the trigger input terminal through the doped sinker region.

In some embodiments, the semiconductor device further includes a conductive element disposed in the substrate. The second terminal region is coupled to the trigger input terminal through the conductive element.

In some embodiments, the conductive element includes a trench or a hole filled with a metallic material.

In some embodiments, the conductive element further couples the trigger element with the cathode/anode terminal of the protection device.

In some embodiments, the protection device includes a vertical thyristor.

Another embodiment provides a method of forming a semiconductor device. A vertical protection device is formed in a substrate. A lateral trigger element for triggering the vertical protection device is formed in the substrate. An electrical path is formed in the substrate to electrically couple the lateral trigger element with the vertical protection device.

In some embodiments, the substrate includes a plurality of epitaxial layers.

In some embodiments, forming the electrical path in the substrate includes forming a doped sinker region connecting two regions of the substrate.

In some embodiments, the method further includes forming a counter-doped region lining sidewalls of the opening.

In some embodiments, forming an electrical path in the substrate includes forming a first opening extending into the substrate and filling the first opening with a metallic conduction layer. The metallic conduction layer electrically couples the lateral trigger element with the vertical protection device.

In some embodiments, the metallic conduction layer completely fills the first opening.

In some embodiments, the metallic conductive layer is disposed along sidewalls of the first opening.

In some embodiments, the method further includes filling a fill material over the metallic conductive layer in the first opening.

In some embodiments, the method further includes forming an insulating sidewall spacer on sidewalls of the first opening. The metallic conductive layer is insulated from sidewalls of the first opening by the sidewall spacer.

In some embodiments, the method further concludes forming a second opening extending into the substrate and filling the second opening with a metallic conduction layer. The vertical protection device is coupled to a first contact pad disposed over a major surface of the substrate. The metallic conduction layer electrically couples the vertical protection device with a second contact pad disposed over the major surface of the substrate.

In another embodiment, a semiconductor device includes a vertical protection device comprising a thyristor disposed in a substrate and a lateral trigger element also disposed in the substrate. The lateral trigger element can be used for triggering the vertical protection device.

In another embodiment, the semiconductor device includes a vertical protection device disposed in a substrate and a lateral trigger element also disposed in the substrate. The lateral trigger element can be used for triggering the vertical protection device. A metal interconnect can couple the lateral trigger element with the vertical protection device.

In some embodiments, the metal interconnect comprises an opening disposed in the substrate. The opening comprises a metallic conduction layer electrically coupling the lateral trigger element with the vertical protection device.

In another embodiment, the semiconductor device includes a first vertical protection device disposed in a substrate and a lateral trigger element disposed in the substrate. The lateral trigger element can be used for triggering the first vertical protection device. A second vertical protection device is disposed in the substrate. The first vertical protection device is configured to provide protection against an electrostatic discharge (ESD) pulse having a first polarity and the second vertical device is configured to provide protection against a ESD pulse having a second polarity opposite to the first polarity.

In some embodiments, the first vertical protection device comprises a thyristor. The second vertical protection device comprises a diode and the lateral trigger element comprises a bipolar transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, embodiments described above in FIGS. 1-20 may be combined with each other in one or more embodiments. It is therefore intended that the appended claims encompass any such modifications or embodiments.

What is claimed is:

1. A method of forming a semiconductor device, the method comprising:
   forming a first vertical protection device comprising a thyristor in a substrate;
   forming a first lateral trigger element for triggering the first vertical protection device in the substrate; and
   forming an electrical path in the substrate to electrically couple the first lateral trigger element with the first vertical protection device;
   forming a second vertical protection device comprising a second thyristor in the substrate;
   forming a second lateral trigger element for triggering the second vertical protection device in the substrate; and forming a second electrical path in the substrate to electrically couple the second lateral trigger element with the second vertical protection device, wherein the first and second vertical protection devices form a bidirectional transient voltage suppressor device, wherein the first and second lateral trigger elements are each configured as bipolar transistors.

2. The method of claim 1, further comprising:
forming a first blocking diode connected in parallel with the first vertical protection device; and
forming a second blocking diode connected in parallel with the second vertical protection device.

3. The method of claim 1, wherein the first and second semiconductor vertical protection devices are each formed over a lower substrate region, wherein the first vertical protection device is configured to conduct between a main surface of the substrate and the lower substrate region, wherein the second vertical protection device is configured to conduct between the main surface of the substrate and the lower substrate region, and wherein the semiconductor device further comprises one or more interconnects coupling the lower substrate region to the main surface.

4. The method of claim 3, further comprising:
forming a first resistor connected in series with the first vertical protection device, and
forming a second resistor connected in series with the second vertical protection device.

5. The method of claim 4, wherein the substrate comprises a first doped region formed over the lower substrate region, wherein the first resistor is provided by a first portion of the first doped region connected with a first one of the interconnects, and wherein the second resistor is provided by a second portion of the first doped region connected with a second one of the interconnects.

6. The method of claim 1, wherein the first vertical protection device and the first lateral trigger element are formed in a first lateral region of the substrate, wherein the second vertical protection device and the second lateral trigger element are formed in a second lateral region of the substrate, and wherein the first lateral region is laterally isolated from the second lateral region.

* * * * *